United States Patent
Yang et al.

(10) Patent No.: US 11,723,156 B2
(45) Date of Patent: Aug. 8, 2023

(54) FOLDABLE DISPLAY DEVICE

(71) Applicant: Samsung Display Co., LTD., Yongin-si (KR)

(72) Inventors: Dong Hyun Yang, Seongnam-si (KR); Sung Bae Ju, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 17/969,681

(22) Filed: Oct. 20, 2022

(65) Prior Publication Data
US 2023/0041469 A1 Feb. 9, 2023

Related U.S. Application Data

(62) Division of application No. 16/912,266, filed on Jun. 25, 2020, now Pat. No. 11,503,723.

(30) Foreign Application Priority Data

Sep. 10, 2019 (KR) ........................ 10-2019-0112383

(51) Int. Cl.
*G06F 1/16* (2006.01)
*H05K 5/00* (2006.01)
*H05K 5/02* (2006.01)

(52) U.S. Cl.
CPC ......... *H05K 5/0017* (2013.01); *G06F 1/1641* (2013.01); *G06F 1/1652* (2013.01); *H05K 5/0226* (2013.01)

(58) Field of Classification Search
CPC .. H05K 5/0017; H05K 5/0226; G06F 1/1616; G06F 1/1618; G06F 1/1682; G06F 1/1652
See application file for complete search history.

(56) References Cited

U.S. PATENT DOCUMENTS

| 9,348,362 | B2* | 5/2016 | Ko ........................ G06F 1/1601 |
| 9,980,373 | B2 | 5/2018 | Jeong et al. |
| 10,289,372 | B2 | 5/2019 | Ahn et al. |
| 10,564,682 | B1 | 2/2020 | Wu et al. |
| 10,831,243 | B2 | 11/2020 | Kim et al. |
| 10,895,894 | B2 | 1/2021 | Jan et al. |

(Continued)

FOREIGN PATENT DOCUMENTS

| KR | 1020160117381 | 10/2016 |
| KR | 1020180062275 | 6/2018 |

*Primary Examiner* — Hung S. Bui
*Assistant Examiner* — Sagar Shrestha
(74) *Attorney, Agent, or Firm* — Cantor Colburn LLP

(57) ABSTRACT

A foldable display device includes a first support member and a second support member separated from each other and each including a short side and long side, a display module disposed on the first support member and the second support member, a hinge which couples a side of the first support member and a side of the second support member, a first rail disposed between the first support member and the display module and disposed along the long side of the first support member, and a second rail disposed between the second support member and the display module and disposed along the long side of the second support member, where the first rail and the second rail are slidable in a first moving direction and a second moving direction opposite to the first moving direction.

6 Claims, 23 Drawing Sheets

(56) References Cited

U.S. PATENT DOCUMENTS

| | | | |
|---|---|---|---|
| 10,912,213 B2* | 2/2021 | Woo | G06F 1/1679 |
| 2004/0052044 A1 | 3/2004 | Mochizuki et al. | |
| 2010/0201604 A1 | 8/2010 | Kee et al. | |
| 2011/0182019 A1 | 7/2011 | Hung et al. | |
| 2012/0314399 A1 | 12/2012 | Bohn et al. | |
| 2014/0226275 A1* | 8/2014 | Ko | G06F 1/1652 |
| | | | 361/679.27 |
| 2015/0378397 A1 | 12/2015 | Park et al. | |
| 2016/0302316 A1 | 10/2016 | Jeong et al. | |
| 2018/0032108 A1 | 2/2018 | Park et al. | |
| 2018/0210513 A1* | 7/2018 | Lin | G06F 1/1641 |
| 2018/0242466 A1 | 8/2018 | Lee et al. | |
| 2018/0295735 A1 | 10/2018 | Ahn | |
| 2019/0012028 A1 | 1/2019 | Park | |
| 2019/0200470 A1 | 6/2019 | Woo | |
| 2019/0302848 A1 | 10/2019 | Han et al. | |

* cited by examiner

FOLDABLE DISPLAY DEVICE

This application is a divisional of U.S. patent application Ser. No. 16/912,266, filed on Jun. 25, 2020, which claims priority to Korean Patent Application No. 10-2019-0112383, filed on Sep. 10, 2019, and all the benefits accruing therefrom under 35 U.S.C. § 119, the content of which in its entirety is herein incorporated by reference.

BACKGROUND

1. Field

Exemplary embodiments of the invention relate to a foldable display device.

2. Description of the Related Art

Display devices display an image and each include a display panel such as a self-light-emitting display panel including organic light-emitting diodes ("OLEDs"), quantum dot electroluminescence ("QD-EL") devices or a liquid crystal display panel.

Mobile electronic devices include the display devices to provide images to users. A percentage of the mobile electronic devices having a larger display screen with providing a volume or a thickness smaller than or equal to that of the conventional mobile electronic devices is increasing. Foldable display devices or bendable display devices, which have a structure that is foldable or unfoldable to provide a larger screen only when being used, are also being developed.

SUMMARY

While a foldable display device has an advantage of a large screen but has a disadvantage in that a risk of damage and deformation due to an external impact is increased. In particular, when the external impact is applied to a corner of the foldable display device, not only an area of the foldable display device, to which the impact is applied, but also a folding area of the foldable display device, to which the impact is transmitted, may be damaged, and thus, a method of preventing the damage is being researched.

Exemplary embodiments of the invention provide a foldable display device in which a rail is disposed between a display panel and a support member, thereby preventing damage to the display panel caused by an external impact.

An exemplary embodiment of a foldable display device includes a first support member and a second support member separated from each other and each including a short side and a long side, a display module disposed on the first support member and the second support member, a hinge which couples a side of the first support member and a side of the second support member, a first rail disposed between the first support member and the display module and disposed along the long side of the first support member, and a second rail disposed between the second support member and the display module and disposed along the long side of the second support member, where the first rail and the second rail are slidable in a first moving direction and a second moving direction opposite to the first moving direction.

An exemplary embodiment of a foldable display device includes a first support member and a second support member are separated from each other and each including a short side and a long side, a metal plate disposed on the first support member and the second support member, a display module disposed on the metal plate, a hinge which coupled a side of the first support member and a side of the second support member, a first rail disposed between the first support member and the metal plate and disposed along the long side of the first support member, and a second rail disposed between the second support member and the metal plate and disposed along the long side of the second support member, where the first rail and the second rail are slidable in a first moving direction and a second moving direction opposite to the first moving direction.

An exemplary embodiment of a foldable display device includes a first support member and a second support member which have short sides and long sides and are separated from each other, a display module disposed on the first support member and the second support member, a hinge which couples one side of the first support member and one side of the second support member, a plurality of first rails disposed between the first support member and the display module and disposed in areas near intersections between the short sides and the long sides of the first support member, and a plurality of second rails disposed between the second support member and the display module and disposed in areas near intersections between the short sides and the long sides of the second support member, where the first rail and the second rail are slidable in a first moving direction and a second moving direction opposite to the first moving direction.

The exemplary embodiments of the invention may provide a foldable display device in which a rail is disposed between a display panel and a support member, thereby preventing damage to the display panel caused by an external impact.

It should be noted that features and advantages of the invention are not limited to the above-described features and advantages, and other aspects, features and advantages of the invention will be apparent to those skilled in the art from the following descriptions.

BRIEF DESCRIPTION OF THE DRAWINGS

The above and other exemplary embodiments and features of the invention will become more apparent by describing exemplary embodiments thereof in detail with reference to the attached drawings, in which.

DETAILED DESCRIPTION

Figure 1:
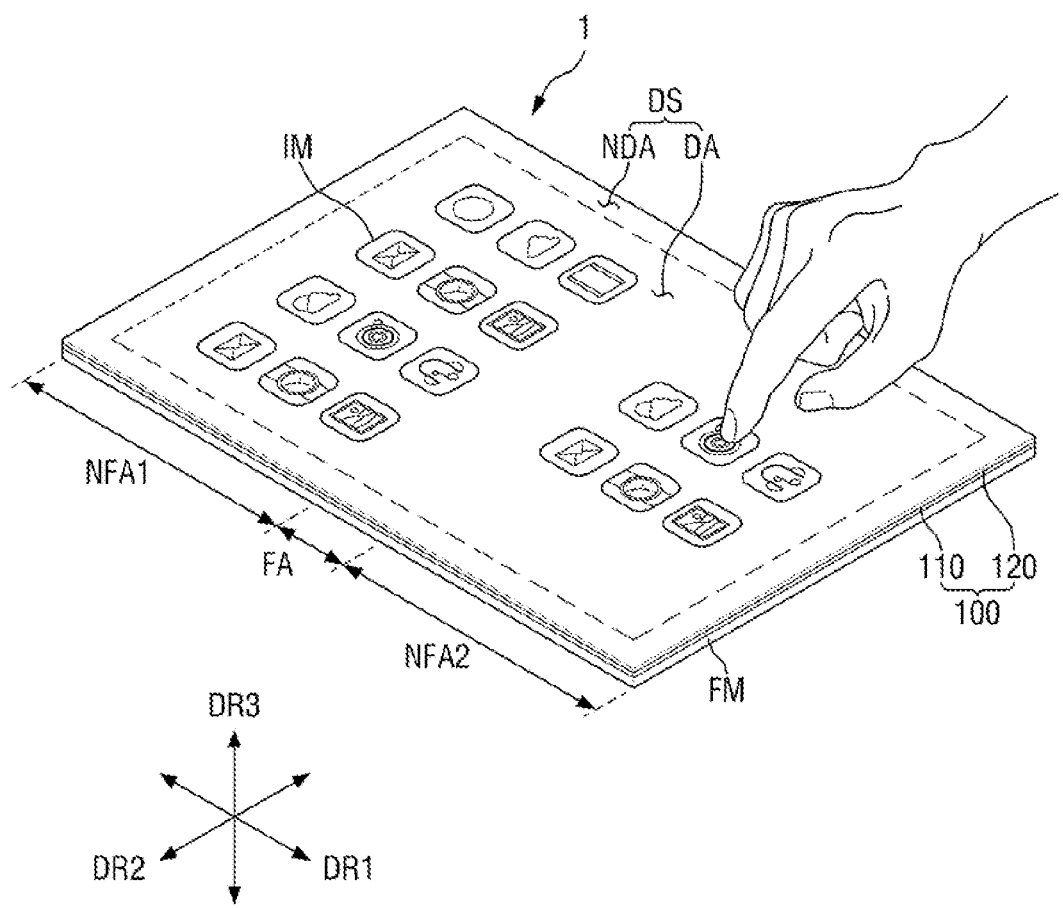
FIG. 1 is a perspective view illustrating an exemplary embodiment of a foldable display device according to the invention.

The invention will now be described more fully hereinafter with reference to the accompanying drawings, in which preferred embodiments of the invention are shown. This invention may, however, be embodied in different forms and should not be construed as limited to the exemplary embodiments set forth herein. Rather, these embodiments are provided so that this invention will be thorough and complete, and will fully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The same reference numbers indicate the same components throughout the specification.

Hereinafter, exemplary embodiments of the invention will be described with reference to the drawings.

Figure 2:
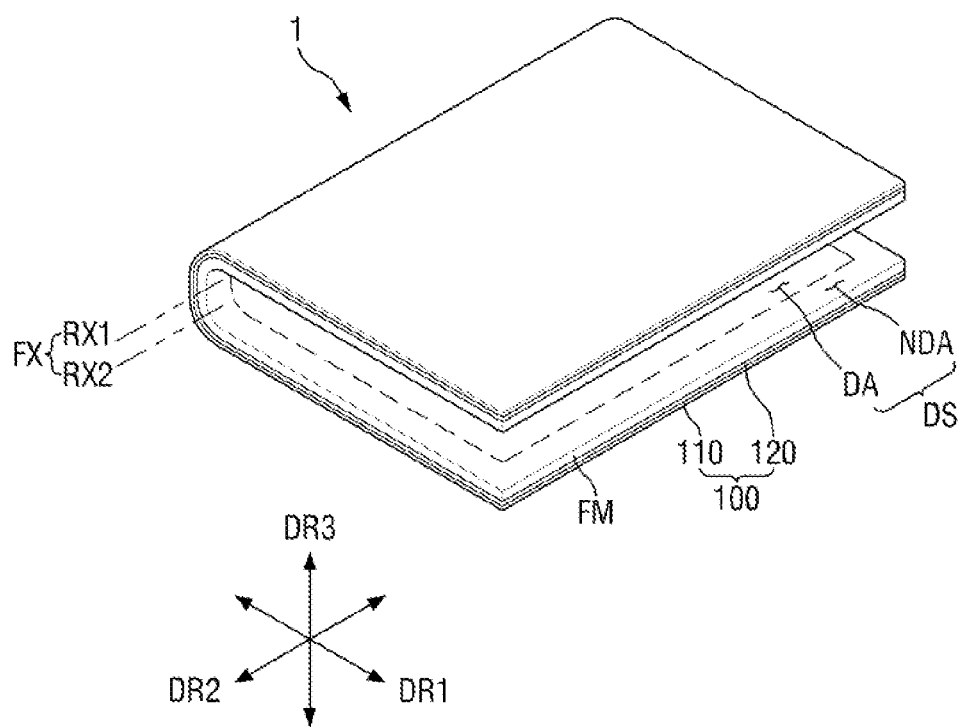
FIG. 2 is a view illustrating a state in which the foldable display device shown in FIG. 1 is folded inward.

FIG. 1 is a perspective view illustrating an exemplary embodiment of a foldable display device according to the invention. FIG. 2 is a view illustrating a state in which the foldable display device shown in FIG. 1 is folded inward.

Referring to FIGS. 1 and 2, a foldable display device 1 in the exemplary embodiment of the invention may have a rectangular shape which has long sides in a first direction DR1 and short sides in a second direction DR2 intersecting the first direction DR1. However, the invention is not limited thereto, and the foldable display device 1 may have various shapes. The foldable display device 1 may be flexible, and may be folded or unfolded with reference to a folding shaft FX extending in the second direction DR2.

Once folded, the foldable display device 1 may be divided into a plurality of areas. In an exemplary embodiment, the foldable display device 1 may be divided into a folding area FA which allows the foldable display device 1 to be folded and two non-folding areas NFA1 and NFA2 in a flat state, for example. The non-folding areas NFA1 and NFA2 are arranged in the first direction DR1, and the folding area FA is disposed between the two non-folding areas NFA1 and NFA2. In the illustrated exemplary embodiment, one folding area FA is defined in the foldable display device 1, but the invention is not limited thereto and a plurality of folding areas may be defined in the foldable display device 1.

In order to provide a biaxial rotation axis to the foldable display device 1, the folding shaft FX includes a first rotation shaft RX1 and a second rotation shaft RX2 which extend in the second direction DR2 and are disposed adjacent to each other. The folding area FA may overlap the first and second rotation shafts RX1 and RX2, and the foldable display device 1 may be folded about the first rotation shaft RX1 and the second rotation shaft RX2.

The foldable display device 1 includes a display module 100 and a folding member FM disposed below the display module 100. An upper surface of the display module 100 may be defined as a display surface DS and may be a planar surface parallel to the first direction DR1 and the second direction DR2. Images IM generated in the display module 100 may be provided to a user through the display surface DS.

The display surface DS includes a display area DA and a non-display area NDA around the display area DA. An image may be displayed in the display area DA, and an image may not be displayed in the non-display area NDA. The non-display area NDA may surround the display area DA and may provide an edge of the foldable display device 1 which is printed with a predetermined color.

The display module 100 has flexibility and includes a display panel 110 and a touch sensing unit 120 disposed on the display panel 110. The display panel 110 may generate an image and provide the image to the user. The display panel 110 may be any one of various display panels such as a liquid crystal display panel, a self-light-emitting display panel including an organic light-emitting diode ("OLED") device or a quantum dot electroluminescence ("QD-EL") device, an electrophoretic display panel, an electro-wetting display panel, and various other display panels capable of displaying an image.

Quantum dots are a semiconductor material having a crystalline structure with a size of several nanometers and include about several hundred to several thousand atoms. Since the quantum dots have a very small size, the quantum dots have a large surface area per unit volume, most of the atoms are provided on a surface of a nanocrystal, and a quantum confinement effect is exhibited. Due to the quantum confinement effect, an emission wavelength may be adjusted only by controlling the size of the quantum dots, and the quantum dots have characteristics such as excellent color purity and high photoluminescence ("PL") emission efficiency. A QD-EL device may be a device having a three-layered structure including a hole transport layer ("HTL") and an electron transport layer ("ETL") at both end portions thereof with a quantum dot light emitting-layer disposed therebetween.

The touch sensing unit 120 may detect an external input (e.g., using a user's hand or a touch pen), convert the external input into an input signal, and provide the input signal to the display panel 110. The touch sensing unit 120 may include a plurality of touch sensors (not shown) for sensing the external input. The touch sensors may sense the external input in a capacitive manner. The display panel 110 may receive an input signal from the touch sensing unit 120 and may generate an image corresponding to the input signal.

The folding member FM may support the display module 100 and may be folded by being rotated about the first and second rotation shafts RX1 and RX2. As the folding member FM is folded, the flexible display module 100 may be folded by the folding member FM. The folding member FM may fold the foldable display device 1 inward so that the display surfaces DS in different areas of the display module 100 face each other when the foldable display device 1 is folded.

A more specific configuration of the folding member FM will be described in detail below with reference to FIG. 4. Hereinafter, a direction intersecting the planar surface parallel to the first direction DR1 and the second direction DR2 is defined as a third direction DR3. The third direction DR3 may include an upper direction and a lower direction opposite to the upper direction.

Figure 3:
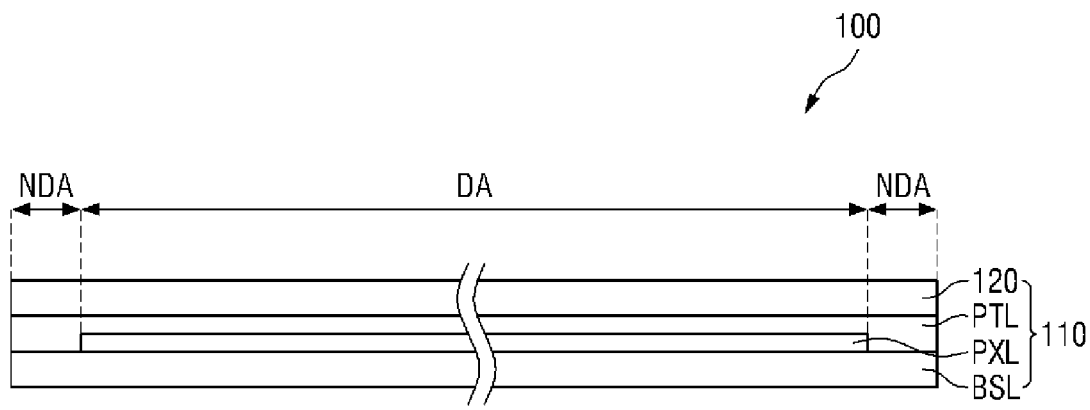
FIG. 3 is a cross-sectional view illustrating the foldable display device shown in FIG. 1.
Figure 3:
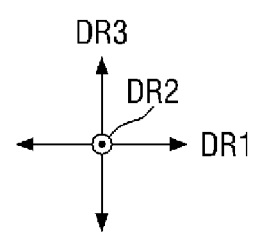

FIG. 3 is a cross-sectional view illustrating the foldable display device shown in FIG. 1.

Referring to FIG. 3, the display panel 110 includes a base layer BSL, a pixel layer PXL disposed on the base layer BSL, and a protective layer PTL disposed on the base layer BSL to cover the pixel layer PXL.

The base layer BSL may define a rear surface of the display module 100 and may have flexibility. The pixel layer PXL may include a plurality of pixels (not shown) and may be driven by receiving an electrical signal to generate the images IM. The protective layer PTL may protect the pixel layer PXL, and the touch sensing unit 120 may be disposed on the protective layer PTL. The protective layer PTL may be provided to include multiple layers and may include an organic insulating layer or an inorganic insulating layer.

Although not shown in the drawing, a window may be further provided on the touch sensing unit 120. The window serves to cover and protect the display module 100. The window may include a transparent material. In an exemplary embodiment, the window may include plastic, for example. In this case, the window may have a flexible characteristic.

Examples of plastic applicable to the window may include, but are not limited to, at least one of polyimide, polyacrylate, polymethylmethacrylate ("PMMA"), polycarbonate ("PC"), polyethylene naphthalate ("PEN"), polyvinylidene chloride, polyvinylidene difluoride ("PVDF"), polystyrene, ethylene vinyl alcohol copolymer, polyethersulphone ("PES"), polyetherimide ("PEI"), polyphenylene sulfide ("PPS"), polyallylate, tri-acetyl cellulose ("TAC"), cellulose acetate propionate ("CAP"), and the like, for example. The window may include at least one selected from the above-described plastic materials.

Figure 4:
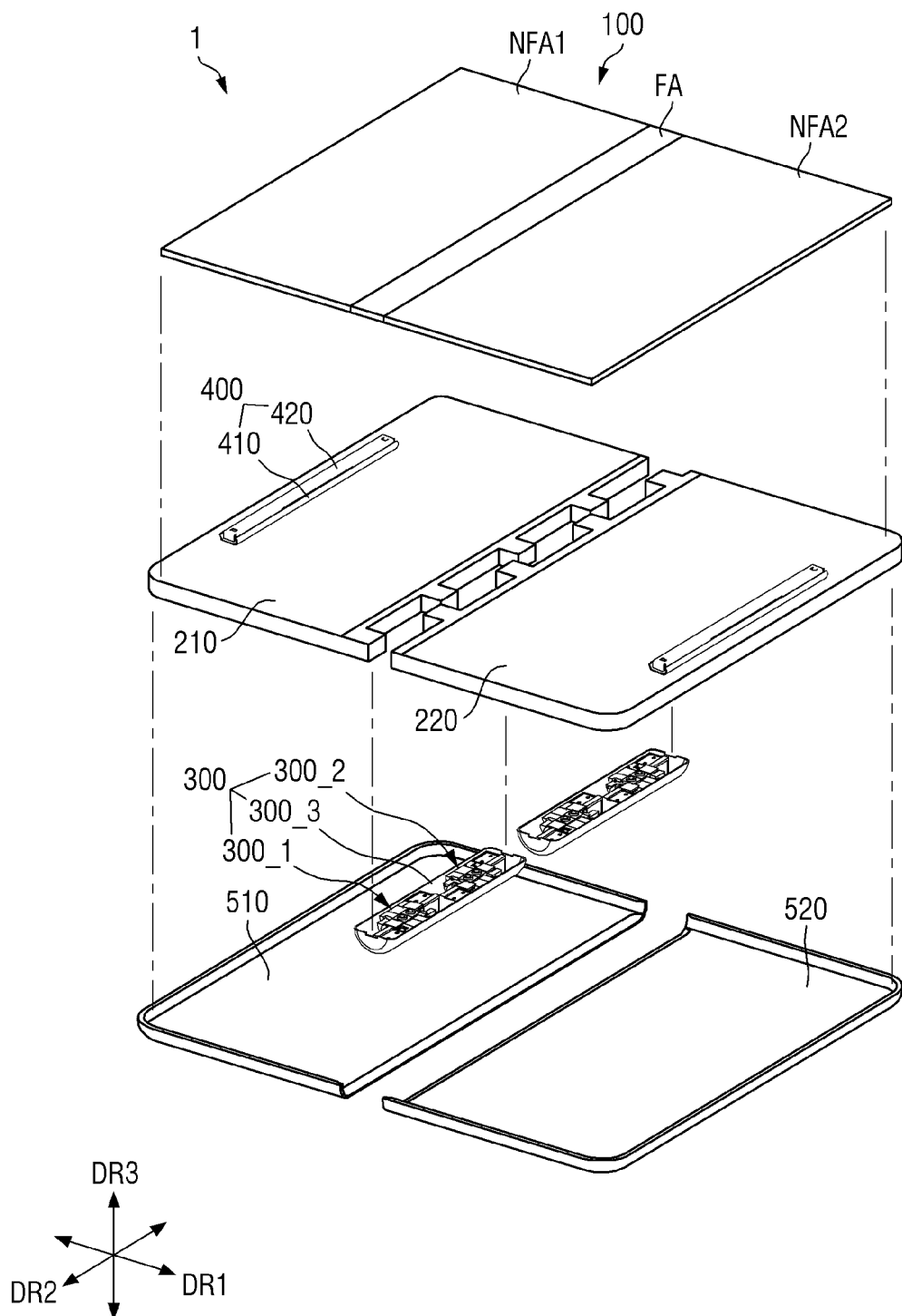
FIG. 4 is an exploded perspective view illustrating an exemplary embodiment of the foldable display shown in FIG. 1.

FIG. 4 is an exploded perspective view illustrating the foldable display shown in FIG. 1.

Referring to FIG. 4, the foldable display device 1 includes the display module 100 and the folding member FM. The folding member FM includes a first support member 210, a second support member 220, a hinge 300, a rail 400, a first rear cover 510, and a second rear cover 520.

The first and second support members 210 and 220 may be arranged in the first direction DR1, and the display module 100 may be disposed on the first and second support members 210 and 220, the hinge 300, and the rail 400.

One side of the first support member 210 and one side of the second support member 220 are disposed to face each other. The folding area FA of the display module 100 is disposed on coupling positions between the first and second support members 210 and 220 and the hinge 300. The non-folding areas NFA1 and NFA2 of the display panel 110 are disposed on upper surfaces of the first and second support members 210 and 220, respectively.

At least one hinge 300 is connected to one side of the first support member 210 and one side of the second support member 220 which face each other in the first direction DR1. The hinge 300 is provided as a rotation shaft for each of one side of the first support member 210 and one side of the second support member 220. The rotation shafts RX1 and RX2 include a first rotation shaft RX1 provided to one side of the first support member 210 and a second rotation shaft RX2 provided to one side of the second support member 220.

The hinge 300 includes a plurality of hinge structures 300_1 and 300_2 arranged in the second direction DR2 and disposed between the first support member 210 and the second support member 220. In an exemplary embodiment, the hinge 300 includes two hinge structures 300_1 and 300_2, for example, but the number of the hinge structures 300_1 and 300_2 is not limited thereto.

The hinge 300 will be described in detail with reference to FIGS. 5 to 12.

A plurality of rails 400 is disposed at one side on the first support member 210 and one side on the second support member 220 in the second direction DR2. The rail 400 may include a first rail member 410 and a second rail member 420. The first rail member 410 may be attached to one surface of the first support member 210, and the second rail member 420 may be attached to one surface of the display module 100 opposite to the first support member 210.

However, the number and arrangement of the rails 400 are not limited thereto. In an exemplary embodiment, one rail 400 may be disposed at each of one side and the other side on the first support member 210 in the second direction DR2, for example. One rail 400 may be disposed at each of one side and the other side on the second support member 220 in the second direction DR2.

The rail 400 provides a separation space for reducing an external impact applied to the foldable display device 1. The rail 400 in the exemplary embodiment may be manufactured in the form of a straight line. The second rail member 420 may be moved by a predetermined distance from one side thereof to the other side thereof or may be moved by a predetermined distance from the other side to the one side in the second direction DR2 with respect to the first rail member 410. That is, the display module 100 to which the second rail member 420 is attached may be moved by a predetermined distance toward each side thereof in the second direction DR2 with respect to the first support member 210 and the second support member 220 to which the first rail members 410 are attached.

Thus, when an external impact is applied to one side of the first support member 210 or the second support member 220 coupled to a case of the foldable display device 1, the display module 100 may be moved by a predetermined distance through the rail 400 in a direction opposite to a direction in which the impact is applied, thereby reducing a risk of damage caused by the impact.

The rail 400 will be described in detail with reference to FIGS. 13 to 16.

The first rear cover 510 may be disposed on a rear surface of the first support member 210 to cover the first support member 210. The first rear cover 510 may be disposed to cover a portion (for example, an upper end portion of a lower surface) of a hinge cover 300_3 disposed between the first support member 210 and the second support member 220. The first rear cover 510 may have rounded corners. The first rear cover 510 may have a hollow shape or may form an empty space with the first support member 210 when being connected to the first support member 210. In an exemplary embodiment, the first rear cover 510 may have a structure which includes a bottom surface with a quadrangular shape and three sidewalls continued from the bottom surface, for example. That is, one side of the quadrangle may be open without a sidewall.

The second rear cover 520 may be disposed on a rear surface of the second support member 220 to cover the second support member 220. The second rear cover 520 may be disposed to cover the remaining portion (for example, a lower end portion) of the hinge cover 300_3 of which a portion is covered by the first rear cover 510. The second rear cover 520 may have rounded corners similar to the first rear cover 510. The second rear cover 520 may have a hollow shape or may form an empty space with the second support member 220 when being connected to the second support member 220. In this regard, the second rear cover 520 may have a structure which has a bottom surface with a quadrangular shape and three sidewalls continued from the bottom surface. That is, one side of the quadrangle may be open without a sidewall.

The hinge 300 may be disposed (e.g., seated) on and fixed to the hinge cover 300_3. The hinge cover 300_3 may be covered by one side of the first rear cover 510 and one side of the second rear cover 520 or be exposed to the outside according to a folded or unfolded state of the flexible display device 1. In an exemplary embodiment, when the foldable display device 1 is unfolded, the hinge cover 300_3 may be covered by the first rear cover 510 and the second rear cover 520, for example. When the foldable display device 1 is folded, the hinge cover 300_3 may be disposed to be exposed to the outside at side portions of the first rear cover 510 and the second rear cover 520.

Hereinafter, the hinge 300 will be described in detail with reference to FIGS. 5 to 12.

Figure 5:
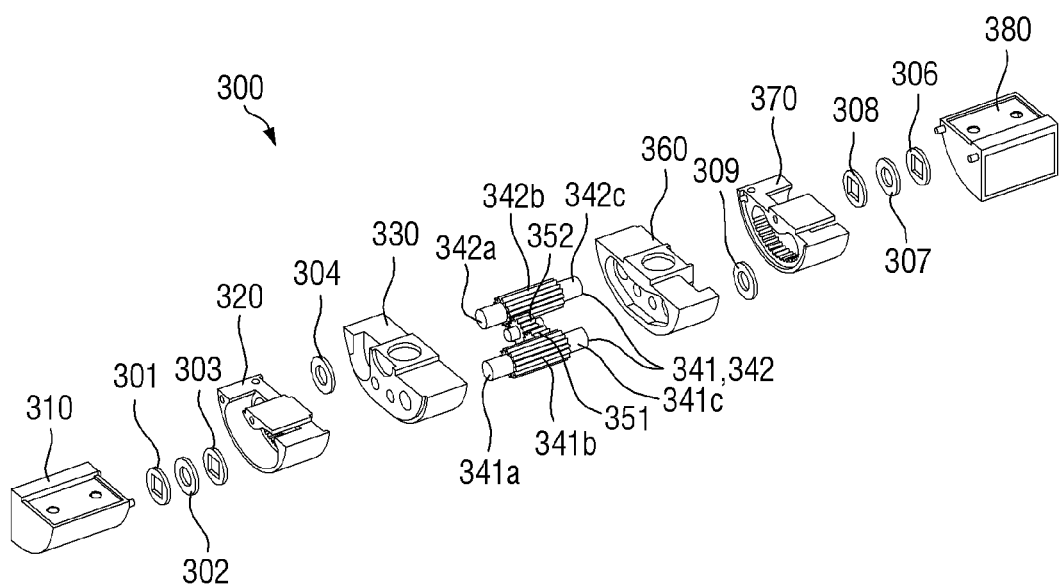
FIG. 5 is an exploded perspective view illustrating an exemplary embodiment of a hinge of the foldable display device.
Figure 6:
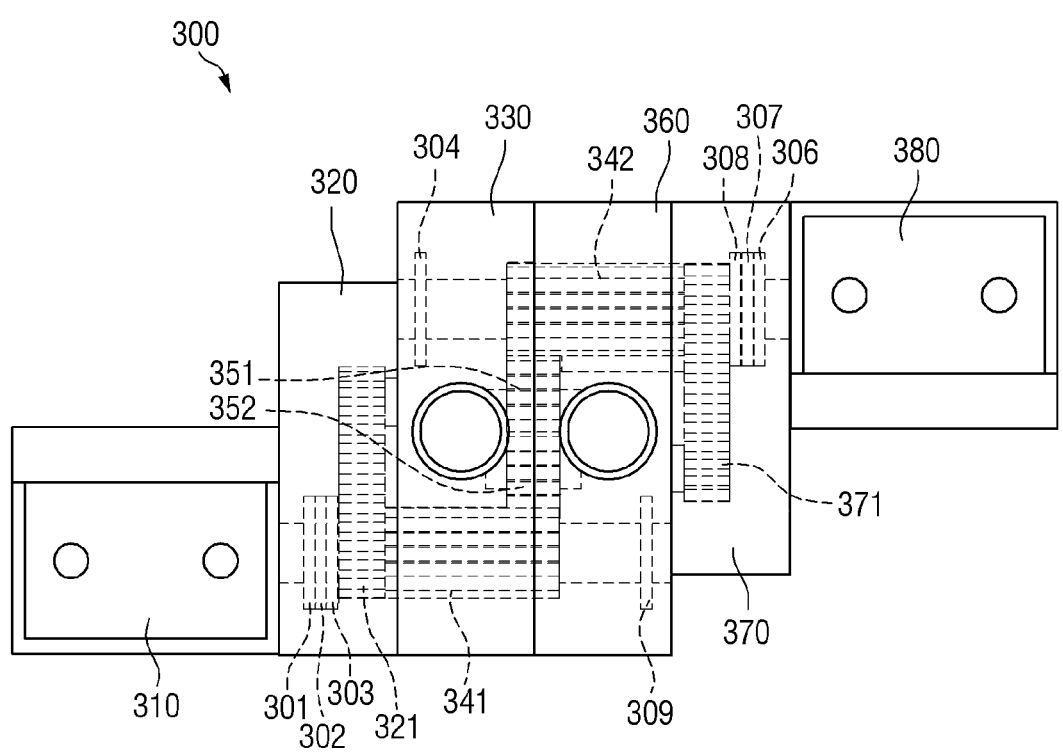
FIG. 6 is a view illustrating an exemplary embodiment of a coupled state of the hinge of the foldable display device.

FIG. 5 is an exploded perspective view illustrating an exemplary embodiment of the hinge of the foldable display device. FIG. 6 is a view illustrating an exemplary embodiment of a coupled state of the hinge of the foldable display device.

Referring to FIGS. 5 and 6, at least a portion of the hinge 300 in the exemplary embodiment may include a first bracket housing 310, first housing washer rings 301 and 303, a first plate spring 302, a first bracket inner gear 320, a first gear washer ring 304, a first bracket center 330, a first main gear 341 (for example, a toothed spur gear), a first shaft gear 351 (for example, a toothed spur gear), a second shaft gear 352 (for example, a toothed spur gear), a second main gear 342 (for example, a toothed spur gear), a second bracket center 360, a second gear washer ring 309, a second bracket inner gear 370, a second plate spring 307, second housing washer rings 306 and 308, and a second bracket housing 380.

The first bracket housing 310 may be disposed adjacent to the first bracket inner gear 320 and may be fixed to the first bracket inner gear 320. In an exemplary embodiment, at least one protrusion may be provided at a right side portion of the first bracket housing 310 and may be fixedly inserted into a groove defined in the first bracket inner gear 320, for example. The first bracket housing 310 may have a cross section with an arc shape of which an inclined angle is a predetermined angle (for example, a right angle). An upper end portion of the first bracket housing 310 may be coupled (for example, screw-coupled) to the second support member 220. A side portion of the first bracket housing 310 may be coupled (for example, magnetically coupled) to the first support member 210. Accordingly, the first bracket housing 310 may be rotated during a hinge motion of the second support member 220. In addition, the first bracket housing 310 may be magnetically coupled to the first support member 210 while the first support member 210 and the second support member 220 are disposed in parallel. The first bracket housing 310 may be separated from the first support member 210 while the first support member 210 and the second support member 220 are folded. A curved portion of the first bracket housing 310 may be disposed to face an inside of the hinge cover 300_3. The first bracket housing 310 may include a material having predetermined rigidity (for example, a metal material). However, the first bracket housing 310 of the invention is not limited to the material.

The first housing washer rings 301 and 303 may be disposed between the first bracket housing 310 and the first bracket inner gear 320, and the first plate spring 302 may be disposed between the first housing washer rings 301 and 303. The first housing washer rings 301 and 303 and the first plate spring 302 may be fixed to the first bracket inner gear 320 using rivets. In various exemplary embodiments, the rivet may be replaced by other fixing members such as a nut and an E-shaped ring. The first housing washer rings 301 and 303 and the first plate spring 302 may be disposed (e.g., seated) in the groove defined at one side of the first bracket inner gear 320. A hole may be defined in the groove so as to pass through the first bracket inner gear 320. A portion of the first main gear 341 passing through the first bracket center 330 and the second bracket center 360 may be disposed in the hole.

The first bracket housing 310 may be fixed to a first side (for example, a left side in FIG. 6) of the first bracket inner gear 320, and the first bracket center 330 may be disposed at a second side (for example, a right side in FIG. 6) thereof. The first bracket inner gear 320 may be rotated along a side surface of the first bracket center 330. The first bracket inner gear 320 may be provided in a semielliptical shape, and an internal gear 321 engaged with the first main gear 341 may be provided inside the first bracket inner gear 320. The internal gear 321 may be provided in a semielliptical arc shape. The first bracket inner gear 320 may include a metal material having predetermined rigidity. In an exemplary embodiment, the first bracket inner gear 320 may include the same material as that of the first bracket housing 310, for example. The material of the first bracket inner gear 320 described in various exemplary embodiments is not limited to the above-described metal material.

The first gear washer ring 304 may be disposed between the first bracket inner gear 320 and the first bracket center 330. In an exemplary embodiment, the first gear washer ring 304 may be disposed (e.g., seated) in a groove (or hole) defined in the first bracket center 330, for example. One side of the second main gear 342 passing through the first bracket center 330 and the second bracket center 360 may be inserted into the first gear washer ring 304.

The first bracket center 330 may be disposed between the first bracket inner gear 320 and the second bracket center 360. The first bracket center 330 may be provided in a semielliptical shape greater than the first bracket inner gear 320. A hole into which a portion of the first main gear 341 is inserted and a hole into which a portion of the second main gear 342 is inserted may be defined in the first bracket center 330. A hole may be defined to vertically pass through a center of the first bracket center 330 (for example, pass from a center of a flat upper end portion to a lower end portion of the semielliptical shape). A boss provided in the hinge cover 300_3 may be inserted into the vertically passing hole.

The first main gear 341 (or a first shaft) may pass through the first bracket center 330 and the second bracket center 360, and one side thereof may be disposed in the internal gear 321 provided in the first bracket inner gear 320. The first main gear 341 may include a first left through portion 341a which protrudes to a left side portion of the first bracket inner gear 320 and passes through the first housing washer rings 301 and 303 and the first plate spring 302 described above, and a first gear pattern portion 341b which is continued from the first left through portion 341a and has one side partially coupled to the internal gear 321 of the first bracket inner gear 320 and the other side partially gear-coupled to the first shaft gear 351, and a first right through portion 341c which passes through a hole defined in the second bracket center 360 and is inserted into the second gear washer ring 309. The first main gear 341 are divided into the first left through portion 341a, the first gear pattern portion 341b, and the first right through portion 341c according to functions or positions thereof. The first left through portion 341a, the first gear pattern portion 341b, and the first right through portion 341c may have a serial structure.

One side of the first shaft gear 351 may be gear-coupled to the gear pattern portion provided in the first main gear 341, and the other side thereof may be gear-coupled to the second shaft gear 352. Accordingly, while the first main gear 341 is rotated, the first shaft gear 351 may transmit a rotational force to the second shaft gear 352. The first shaft gear 351 may be disposed inside a cavity defined when the first bracket center 330 and the second bracket center 360 are coupled.

One side of the second shaft gear 352 may be gear-coupled to a gear pattern portion provided in the second main gear 342, and the other side thereof may be gear-coupled to the first shaft gear 351. While the second main gear 342 is rotated, the second shaft gear 352 may transmit a rotational force to the first shaft gear 351. The second shaft gear 352 may be disposed inside the cavity defined when the first bracket center 330 and the second bracket center 360 are coupled. In various exemplary embodiments, the size and number of idle gears (for example, the first shaft gear 351 and the second shaft gear 352) may be changed to reduce the set thickness of the foldable display device 1. Accordingly, the foldable display device 1 of the invention is not limited to the number and size of the shaft gears. In an exemplary embodiment, in order to reduce the set thickness of the foldable display device 1, the first shaft gear 351 and the second shaft gear 352 may be provided to have a small size of a predetermined dimension or less, for example. Accordingly, the foldable display device 1 may have a hinge structure including two first shaft gears and two second shaft gears. A size of the two first shaft gears or the two second shaft gears may be half of a size of one first shaft gear or one second shaft gear. In an alternative exemplary embodiment, the hinge structure of the foldable display device 1 may include three first shaft gears and three second shaft gears.

The second main gear 342 (or a second shaft) may have substantially the same shape as that of the first main gear 341. In an exemplary embodiment, the second main gear 342 may include a second right through portion 342c which passes through a right side portion of the second bracket inner gear 370 and is inserted into the second housing washer rings 306 and 308 and the second plate spring 307, a second gear pattern portion 342b which has one side gear-coupled to an internal gear 371 of the second bracket inner gear 370 and the other side partially gear-coupled to the second shaft gear, and a second left through portion 342a which passes through a hole defined in the first bracket center 330 and is inserted into the first gear washer ring 304, for example. A left or right direction of the above-described through portions are defined based on the illustrated drawings and may be named differently according to a change in arrangement direction.

The second bracket center 360 may be disposed between the first bracket center 330 and the second bracket inner gear 370. The second bracket center 360 may be provided to have substantially the same shape as that of the first bracket center 330 (for example, having a semielliptical shape greater than that of the second bracket inner gear 370). Through-holes through which the first main gear 341 and the second main gear 342 pass may be defined in the second bracket center 360. A hole may be defined to vertically pass through a flat upper end portion to a lower end portion of the second bracket center 360 so that a boss of the hinge cover 300_3 is coupled thereto.

The second gear washer ring 309 may be disposed (e.g., seated) in a groove defined in the second bracket center 360 when being coupled to an end portion of the first right through portion 341c of the first main gear 341.

The second bracket inner gear 370 may be disposed between the second bracket center 360 and the second bracket housing 380. The shape and material of the second bracket inner gear 370 may be substantially the same as the shape and material of the first bracket inner gear 320 described above. In an exemplary embodiment, the second bracket inner gear 370 may be provided to have a semielliptical shape with a size smaller than that of the second bracket center 360, and an internal gear 371 may be provided in a predetermined area of the second bracket inner gear 370 to be gear-coupled to the second main gear 342, for example.

The second housing washer rings 306 and 308 and the second plate spring 307 may be disposed (e.g., seated) in a groove (or a hole) defined in one side of the second bracket inner gear 370 and may be coupled to the second right through portion 342c of the second main gear 342. The second plate spring 307 may be disposed between the second housing washer rings 306 and 308 to laterally apply an elastic force to the second housing washer rings 306 and 308.

The second bracket housing 380 may be provided to have substantially the same shape and material as those of the first bracket housing 310 described above and may be disposed in a direction opposite to the first bracket housing 310. In an exemplary embodiment, the second bracket housing 380 may be fixed to one side of the first bracket inner gear 320, for example. The second bracket housing 380 may include a curved portion of which an outer circumferential surface has a predetermined curvature and end portions forming the curved portion. An upper end portion among the end portions may be coupled (for example, screw-coupled) to the first support member 210. A side portion among the end portions may be coupled (for example, magnetically coupled) to the second support member 220.

Figure 7:
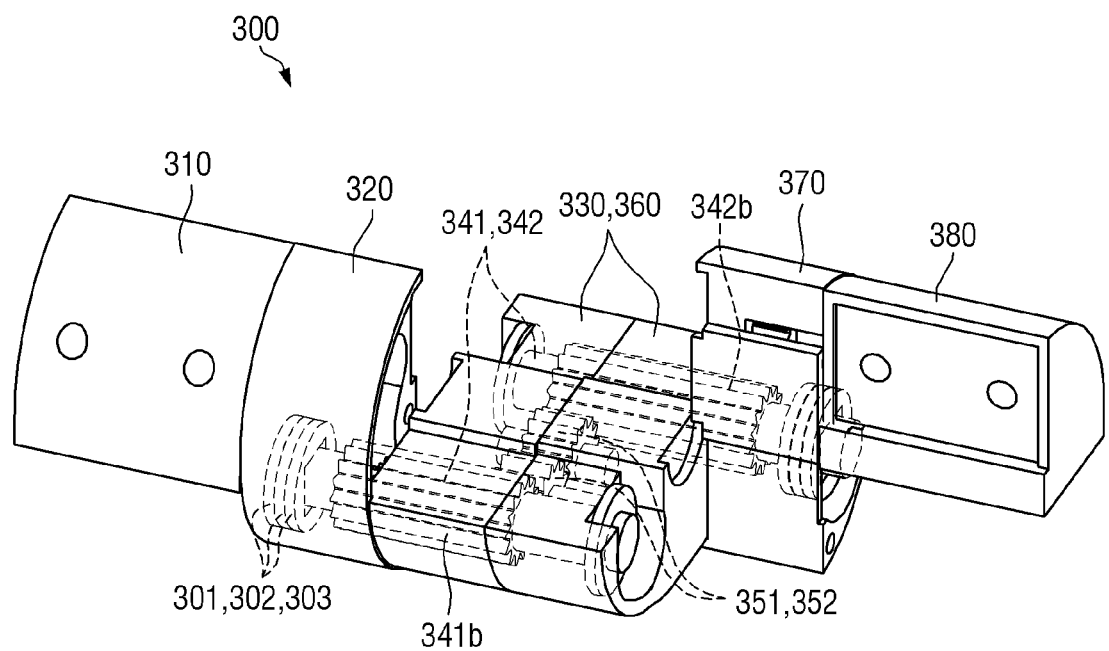
FIG. 7 is a view illustrating a rotation state of the hinge of the foldable display device.

FIG. 7 is a view illustrating an exemplary embodiment of a rotation state of the hinge of the foldable display device.

Referring to FIGS. 5 and 7, in the exemplary embodiment of the hinge 300, the first bracket center 330 and the second bracket center 360 may be disposed such that side surface portions thereof (for example, a right side portion of the first bracket center 330 and a left side portion of the second bracket center 360 in the drawings) face each other. The first main gear 341 may be disposed to pass through the holes defined in lower sides among the holes of the first bracket center 330 and the second bracket center 360 in the drawings. One side of the first gear pattern portion 341b of the first main gear 341 may be gear-coupled to the internal gear 321 of the first bracket inner gear 320. The second main gear 342 may be disposed to pass through the holes defined in upper sides among the holes of the first bracket center 330 and the second bracket center 360 in the drawings. One side of the second gear pattern portion 342b of the second main gear 342 may be gear-coupled to the internal gear 371 of the second bracket inner gear 370. The first bracket housing 310 may be coupled to a left side of the first bracket inner gear 320, and the second bracket housing 380 may be coupled to a right side of the second bracket inner gear 370.

In a state in which the first bracket housing 310 is coupled to the second support member 220 and the second bracket housing 380 is coupled to the first support member 210, when external pressure is applied to the first support member 210 or the second support member 220 so that the first support member 210 and the second support member 220 are folded in a direction in which the first support member 210 and the second support member 220 face each other, as shown in drawings, the first bracket housing 310 and the first bracket inner gear 320 may be disposed in a state of being rotated by a first angle (for example, 90°) from the initial state thereof in a counterclockwise direction with respect to the first bracket center 330. Similarly, the second bracket housing 380 and the second bracket inner gear 370 may be disposed in a state of being rotated by the first angle (for example, 90°) from the initial state thereof in a clockwise direction with respect to the second bracket center 360. The first direction and the second direction may be opposite to each other.

Figure 8A:
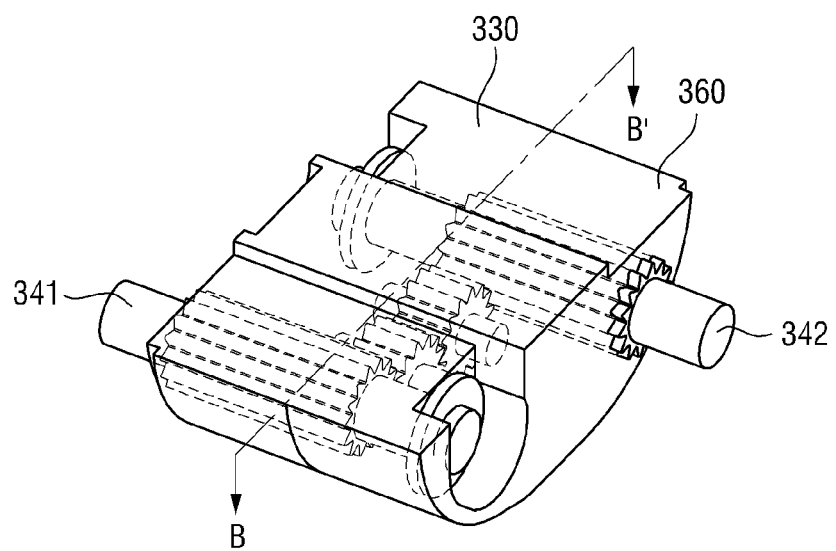
FIGS. 8A and 8B are views illustrating an exemplary embodiment of forms of components related to bracket centers in the foldable display device.
Figure 8B:
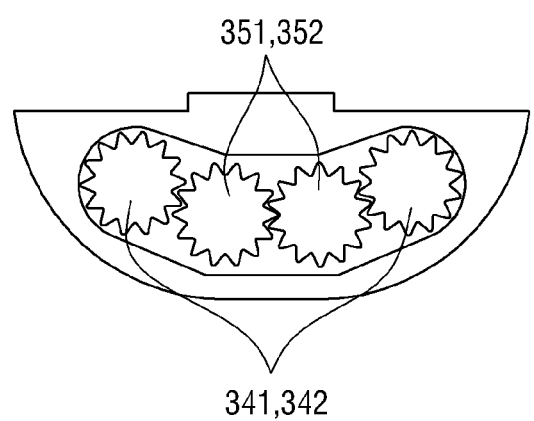

FIGS. 8A and 8B are views illustrating an exemplary embodiment of forms of components of the bracket centers in the foldable display device.

Referring to FIGS. 8A and 8B, as described above, the hinge 300 in the exemplary embodiment may include the first bracket housing 310, the first bracket inner gear 320, the first bracket center 330, the second bracket center 360, the second bracket inner gear 370, and the second bracket housing 380.

FIGS. 8A and 8B are views illustrating only the bracket centers 330 and 360, the main gears 341 and 342, and the shaft gears 351 and 352. The first main gear 341 and the second main gear 342 may be disposed to pass through the first bracket center 330 and the second bracket center 360.

FIG. 8B is a cross-sectional view taken along line B-B' of FIG. 8A. As shown in the drawing, the first shaft gear 351 gear-coupled to the first main gear 341 and the second shaft gear 352 gear-coupled to the second main gear 342 and the first shaft gear 351 may be disposed in a central cavity defined when the bracket centers 330 and 360 are coupled. In the above-described structure, when the first main gear 341 is rotated in a first direction (for example, a clockwise direction), the first shaft gear 351 may be rotated in a second direction (for example, a counterclockwise direction), the second shaft gear 352 gear-coupled to the first shaft gear 351 may be rotated in the first direction again, and the second main gear 342 gear-coupled to the second shaft gear 352 may be rotated in the second direction. As described above, the first main gear 341 and the second main gear 342 may be rotated in opposite directions within a limited range by the first shaft gear 351 and the second shaft gear 352.

Figure 9A:
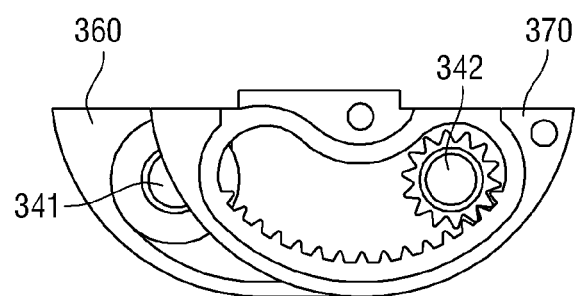
FIGS. 9A and 9B are views illustrating exemplary embodiments of operation states of the bracket centers and bracket inner gears in the foldable display device.
Figure 9B:
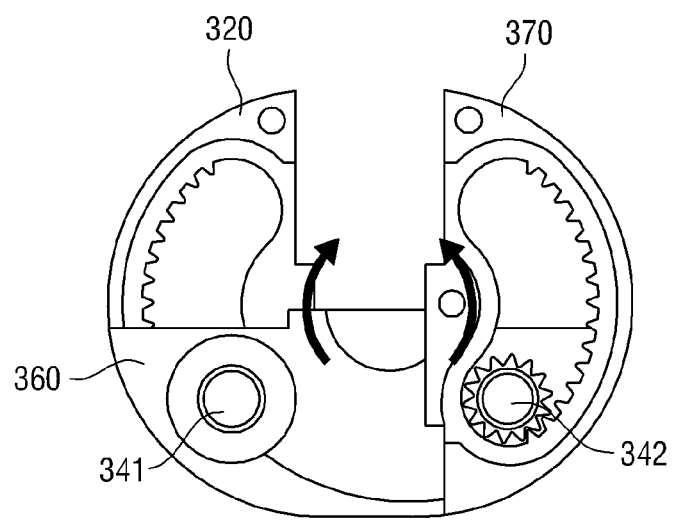
Figure 10:
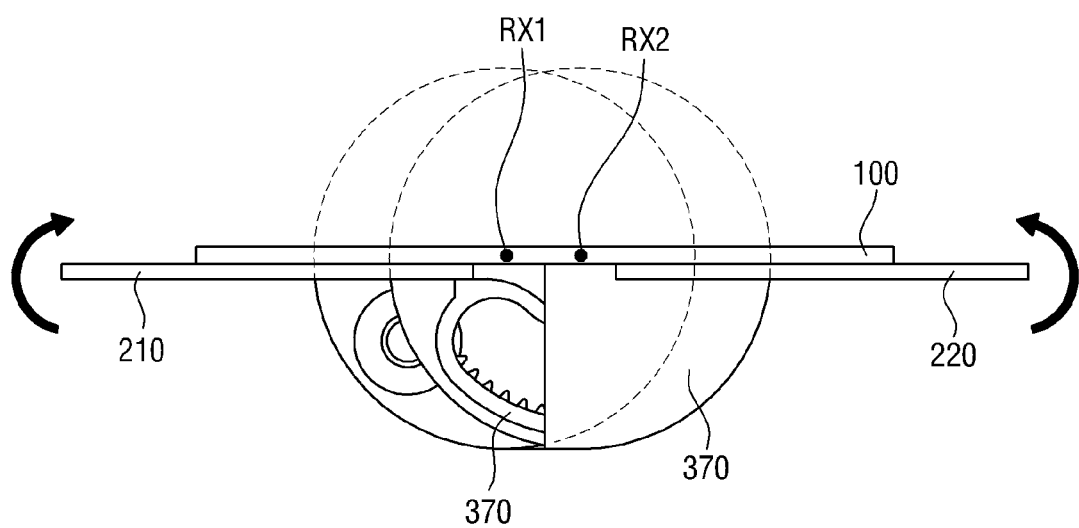
FIG. 10 is a view illustrating an arrangement state of the foldable display device according to an arrangement form of the hinge.

FIGS. 9A and 9B are views illustrating exemplary embodiments of operation states of the bracket centers and the bracket inner gears in the foldable display device. FIG. 10 is a view illustrating an arrangement state of the foldable display device according to an arrangement form of the hinge.

Referring to FIG. 9A, FIG. 9A illustrates at least a portion of a hinge structure viewed in a direction in which the second bracket inner gear 370 is disposed in a state in which the foldable display device 1 is flat. Referring to FIG. 9B, FIG. 9B illustrates at least a portion of the hinge viewed in the direction in which the second bracket inner gear 370 is disposed in a state in which the foldable display device 1 is folded at a second angle (for example, an angle at which the first support member and the second support member face each other).

FIGS. 9A and 9B are views illustrating a shape of the second bracket inner gear 370 coupled to the second bracket center 360. A portion of the gear pattern portion of the second main gear 342, which is disposed to be biased to the right with respect to a vertical center line of the second bracket center 360, may be gear-coupled to an internal gear 371 of the second bracket inner gear 370 and may be rotated by external pressure. In an exemplary embodiment, when a force is continuously applied, the second bracket inner gear 370 may be disposed parallel with the vertical center line of the second bracket center 360, for example. As the second bracket inner gear 370 is rotated, the first bracket inner gear 320 may be rotated in a direction opposite to a rotation direction of the second bracket inner gear 370. Accordingly, as shown in the drawings, flat surfaces of the first bracket inner gear 320 and the second bracket inner gear 370 may be disposed in parallel with vertical center lines of the bracket centers 330 and 360 (or may be disposed perpendicular to horizontal center lines of the bracket centers 330 and 360). As described above, since the first bracket inner gear 320 and the second bracket inner gear 370 are coupled at positions spaced from centers of the bracket centers 330 and 360 through the first main gear 341 and the second main gear 342 (for example, positions biased to a right edge or a left edge), as shown in FIG. 10, when the first bracket inner gear 320 and the second bracket inner gear 370 are rotated, virtual rotation shafts (axes) RX1 and RX2 may be disposed at a predetermined level upward from surfaces of the first support member 210 and the second support member 220, at a predetermined level upward from the rear surface of the display module 100, at a predetermined level upward from an upper surface of the display module 100, or at a predetermined level upward from the horizontal center lines of the bracket centers 330 and 360. In an alternative exemplary embodiment, the virtual rotation shafts RX1 and RX2 may be disposed above a bottom surface or a lowest surface of the display module 100 when viewed from above to below in the drawing.

The shape and size of internal gears 321 and 371 of the first bracket inner gear 320 and the second bracket inner gear 370 (for example, a size of a curved round hole with an end portion defined in a partial shape of an arc such that a main gear is inserted thereinto, and the number and size of valleys and ridges of the internal gears 321 and 371) may be adjusted in order for positions at which the first bracket inner gear 320 and the second bracket inner gear 370 should be disposed in parallel with the bracket centers 330 and 360 and be disposed at an angle of 90° with respect to the bracket centers 330 and 360.

In the foldable display device 1, shapes of the internal gears may restrict maximum rotation widths of the bracket inner gears 320 and 370 such that the bracket inner gears 320 and 370 are rotated within a range of 90° with respect to the horizontal center lines of the bracket centers 330 and 360. In this case, since the bracket inner gears 320 and 370 are disposed to be biased to left and right sides of the bracket centers 330 and 360, respectively, in a state in which the first support member 210 and the second support member 220 are folded to face each other, a gap with a predetermined size may be defined between the bracket inner gears 320 and 370. The gap with such a size may allow a bent degree of a central area of the display module 100 to be always maintained constant. In an exemplary embodiment, the central area of the display module 100 may be bent in a "U" shape in a state in which the first and second support members 210 and 220 are folded, for example. Since the display module 100 is bent in the "U" shape, a stress point (for example, an inflection point) generated in the central area may be relatively lower as compared with other shapes (for example, a display folded in a drop shape or ajar shape). Thus, the display module 100 may receive less stress. Accordingly, the foldable display device 1 of the invention may have a relatively longer lifespan.

Figure 11:
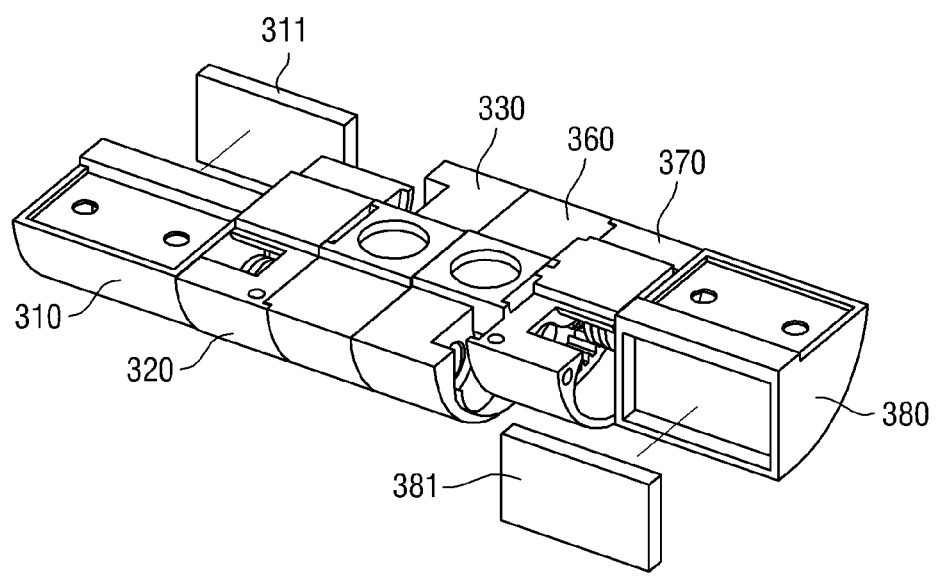
FIG. 11 is a view illustrating an exemplary embodiment of an arrangement of magnet members of the hinge in the foldable display device.
Figure 11:
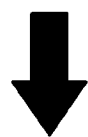
Figure 11:
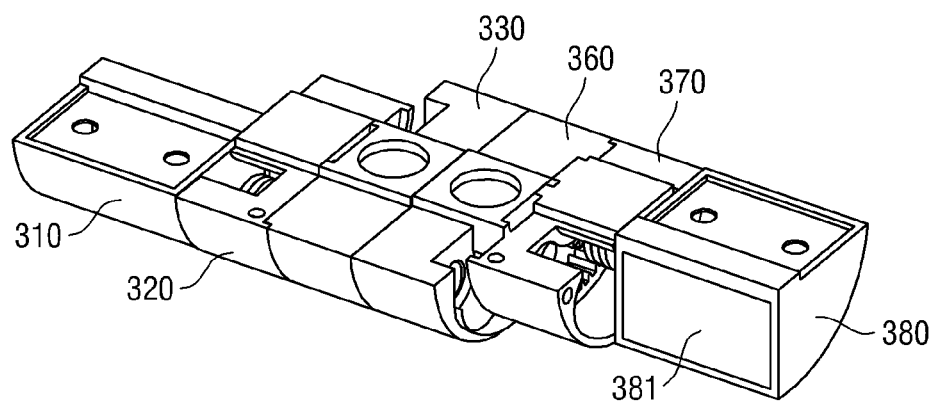

FIG. 11 is a view illustrating an exemplary embodiment of an arrangement of magnet members of the hinge in the foldable display device.

Referring to FIG. 11, as described above, the hinge 300 may include the first bracket housing 310, the first bracket inner gear 320, the first bracket center 330, the second bracket center 360, the second bracket inner gear 370, and the second bracket housing 380. The main gears and the shaft gears may be disposed to pass through the bracket centers 330 and 360 in order for the rotation of the first bracket inner gear 320 and the second bracket inner gear 370.

A first magnet member 311 may be disposed at one side of the first bracket housing 310. In an exemplary embodiment, in the drawing, in a state in which a surface of the first bracket housing 310, which defines coupling holes to be coupled to the second support member 220, is disposed at an upper side, the first magnet member 311 may be disposed at a side portion of the first bracket housing 310, in which a curved portion is not provided, for example. The side portion may have a mounting groove with a predetermined depth such that the first magnet member 311 may be fixedly disposed (e.g., seated) therein. The above-described first magnet member 311 may be fitted (for example, forcibly fitted) into the mounting groove defined at the side portion of the first bracket housing 310 or may be fixed to the mounting groove defined at the side portion through a separate adhesive member.

A second magnet member 381 may be disposed at one side of the second bracket housing 380. In an exemplary embodiment, in the drawing, in a state in which a surface of the second bracket housing 380, which defines coupling holes to be coupled to the first support member 210, is disposed at an upper side, the second magnet member 381 may be disposed at a side portion of the second bracket housing 380, in which a curved portion is not provided, for example. The side portion may have a mounting groove with a predetermined depth such that the second magnet member 381 may be fixedly disposed (e.g., seated) therein. The above-described second magnet member 381 may be fitted (for example, forcibly fitted) into the mounting groove defined in the side portion of the second bracket housing 380 or may be fixed to the mounting groove defined in the side portion through a separate adhesive member.

Figure 12:
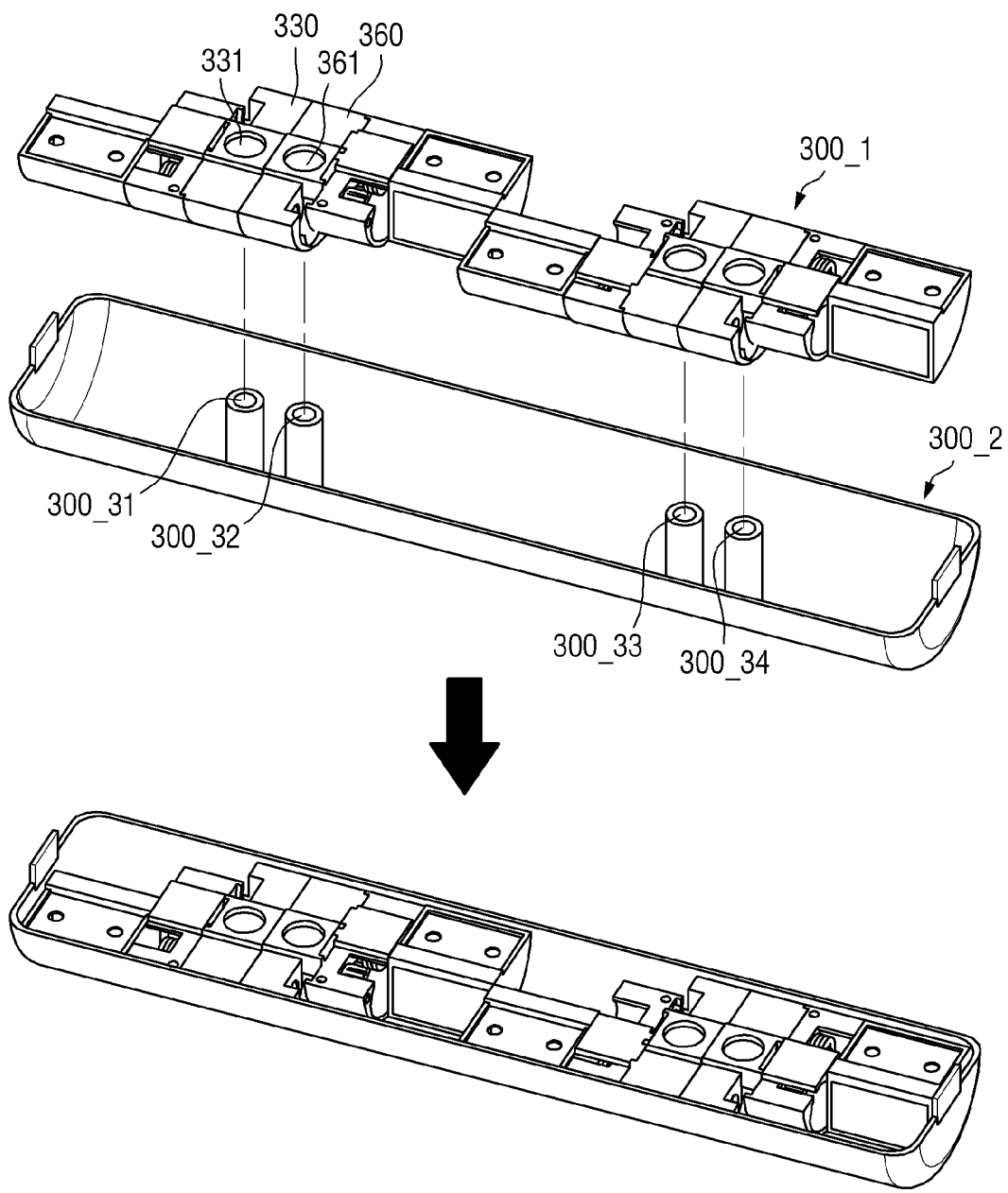
FIG. 12 is a view illustrating an exemplary embodiment of coupling between the hinge and a hinge case of the foldable display device.

FIG. 12 is a view illustrating an exemplary embodiment of coupling between the hinge and a hinge case of the foldable display device.

Referring to FIG. 12, the foldable display device 1 may include a first hinge structure 300_1 and a second hinge structure 300_2. The invention is not limited thereto. In an exemplary embodiment, the foldable display device 1 may include only one hinge structure or include three or more hinge structures as necessary, for example. In an exemplary embodiment, the number of the hinge structures may be designed to be increased or decreased in accordance with the size of the foldable display device 1, for example.

In the first hinge structure 300_1, a first through-hole 331 may be defined to pass through a center of a flat surface to a bottom surface of the first bracket center 330. A first boss 300_31 provided in the hinge cover 300_3 may be inserted into the first through-hole 331.

In the first hinge structure 300_1, a second through-hole 361 may be defined to pass through a center of a flat surface to a bottom surface of the second bracket center 360. A second boss 300_32 provided in the hinge cover 300_3 may be inserted into the second through-hole 361.

The hinge cover 300_3 may include a housing body and the first boss 300_31, the second boss 300_32, a third boss 300_33, and a fourth boss 300_34 disposed inside the housing body. The housing body may have, for example, closed left and right edges, an open upper side, and a hollow shape, and thus may have a vertical cross section with a semielliptical shape. A curved portion of the above-described hinge 300 may be disposed to face an inner surface of the housing body.

The first boss 300_31 and the second boss 300_32 may be disposed at one side of the housing body to be coupled to the first through-hole 331 defined in the first bracket center 330 of the hinge 300 and the second through-hole 361 defined in the second bracket center 360.

The second hinge structure 300_2 may be provided to have substantially the same shape as that of the first hinge structure 300_1 described above. When bracket centers included in the second hinge structure 300_2 are disposed (e.g., seated) on the hinge cover 300_3, through-holes defined in the bracket centers may be connected to the third boss 300_33 and the fourth boss 300_34 of the hinge cover 300_3.

In the above description, an exemplary embodiment of the structure of the rail 400 in which two hinge structures are disposed has been described, but the invention is not limited thereto. In an exemplary embodiment, one hinge structure or three or more hinge structures may be disposed in the rail 400, for example. As described above, the number of the hinge structures may be increased or decreased in accordance with the size of the foldable display device 1.

Figure 13:
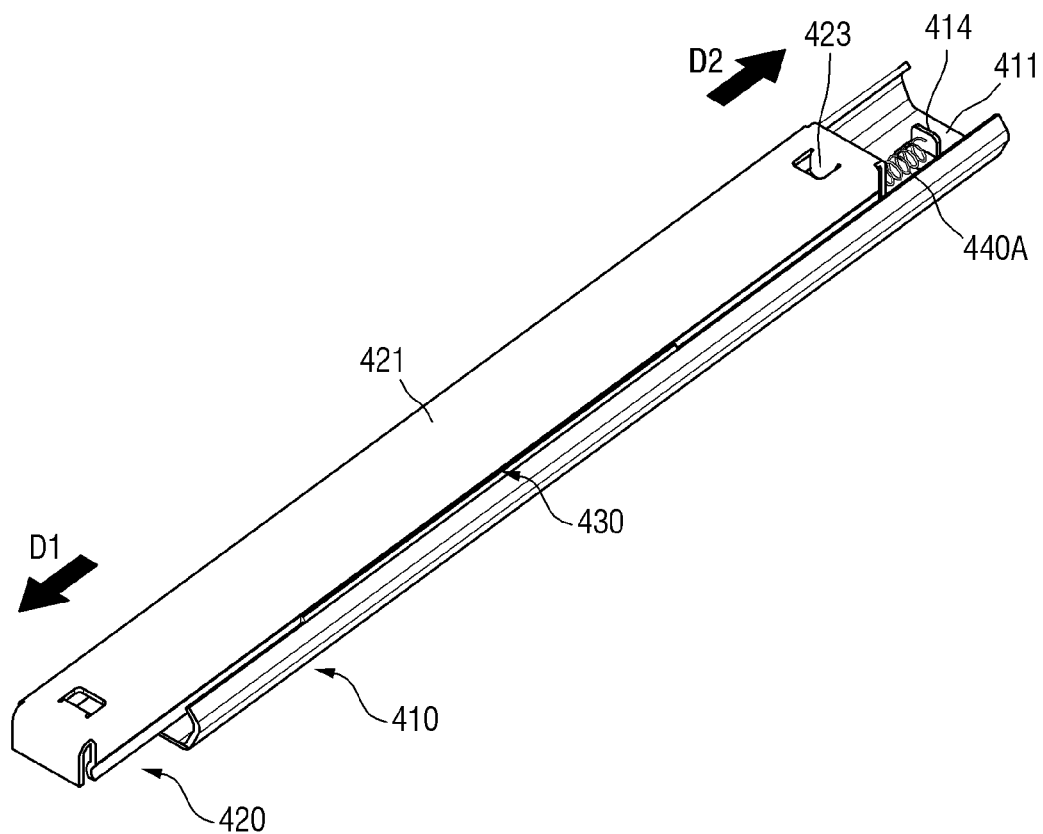
FIG. 13 is a perspective view illustrating a rail shown in FIG. 4.
Figure 14:
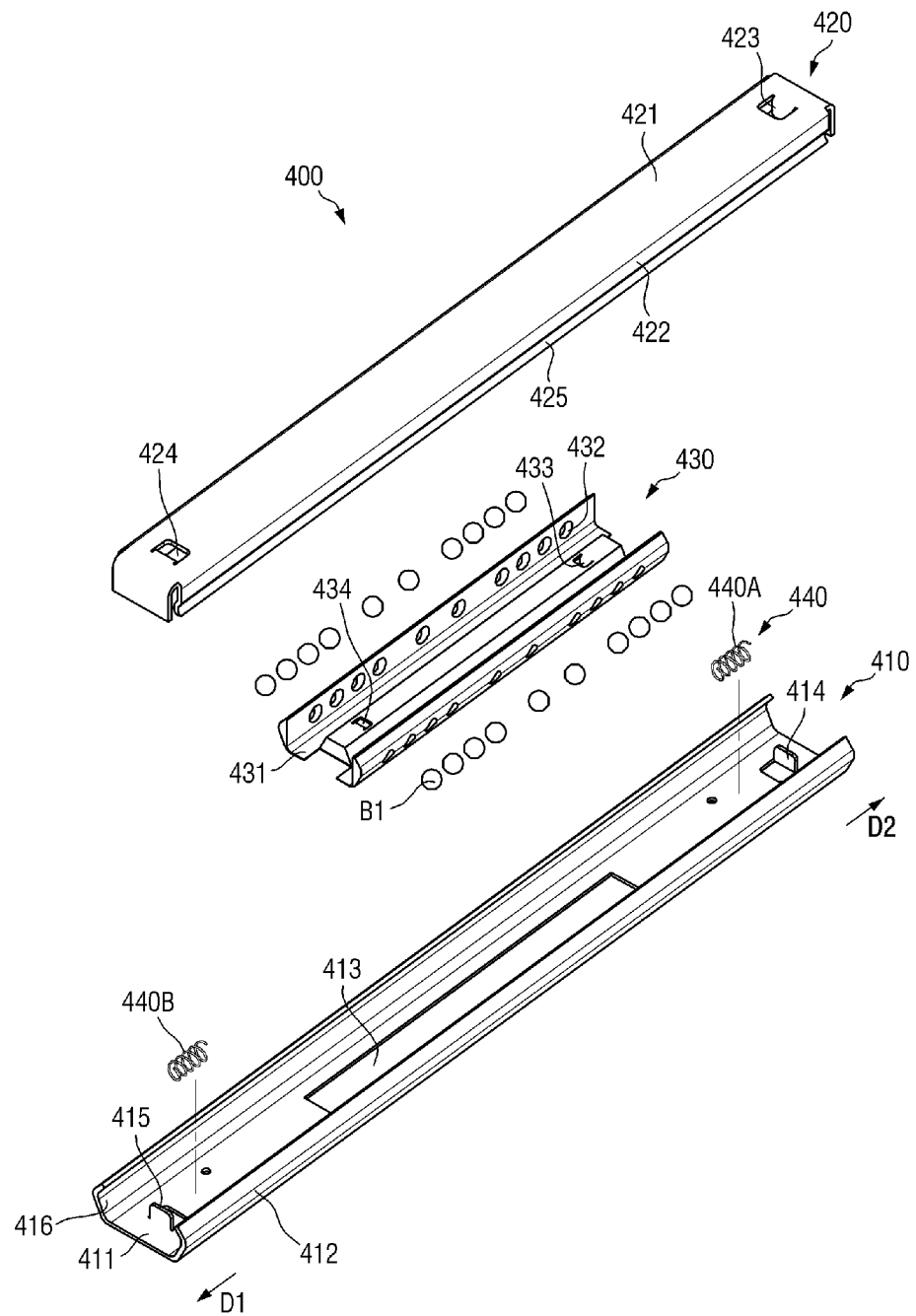
FIG. 14 is an exploded perspective view illustrating the rail shown in FIG. 13.

FIG. 13 is a perspective view illustrating the rail shown in FIG. 4. FIG. 14 is an exploded perspective view illustrating the rail shown in FIG. 13.

Hereinafter, the rail 400 will be described with reference to FIGS. 13 and 14.

The rail 400 may include the first rail member 410 which is attached to one surface of the first support member 210 (refer to FIG. 4), the second rail member 420 which is attached to one surface of the display module 100 (refer to FIG. 4) opposite to the first support member 210 and is slidably coupled to the first rail member 410, a third rail member 430 which supports a sliding movement of the first rail member 410 and the second rail member 420, and an elastic member 440 which mitigates an impact when the first rail member 410 and the second rail member 420 slide.

The first rail member 410 is attached to one surface of the first support member 210 to support the display module 100 to be slidable. The first rail member 410 may include a first rail member body 411 and first rail member flanges 412 provided to be bent from both sides of the first rail member body 411.

In order to prevent the second rail member 420 from deviating in a second moving direction D2, a first support protrusion 414 may be provided at one side of the first rail member body 411 in the second moving direction D2 to support a third support protrusion 423 disposed on the second rail member 420. The first support protrusion 414 may be provided by bending a portion of the first rail member body 411 in a direction in which the second rail member 420 is coupled. The third support protrusion 423 may be provided by bending a portion of a second rail member body 421 in a direction in which the first rail member 410 is coupled. Accordingly, the second rail member 420 may be prevented from deviating from the first rail member 410 in the second moving direction D2.

In order to prevent the second rail member 420 from deviating in a first moving direction D1, a second support protrusion 415 may be provided at one side of the first rail member body 411 in the first moving direction D1 to support a fourth support protrusion 424 disposed on the second rail member 420. The second support protrusion 415 may be provided by bending a portion of the first rail member body 411 in a direction in which the second rail member 420 is coupled. The fourth support protrusion 424 may be provided by bending a portion of the second rail member body 421 in a direction in which the first rail member 410 is coupled. Accordingly, the second rail member 420 may be prevented from deviating from the first rail member 410 in the first moving direction D1.

The first rail member body 411 may include a first guider 413 into which a first guide protrusion 433 and a second guide protrusion 434 of the third rail member 430 are inserted and which guides the first guide protrusion 433 and the second guide protrusion 434. The first guider 413 may be provided along a movement path of the first guide protrusion 433 and the second guide protrusion 434. One side surface of the first guider 413 in the second moving direction D2 may be in contact with the first guide protrusion 433 and may restrict the first guide protrusion 433 from moving in the second moving direction D2. One side surface of the first guider 413 in the first moving direction D1 may be in contact with the second guide protrusion 434 and may restrict the second guide protrusion 434 from moving in the first moving direction D1.

A first rail raceway 416 on which a first ball B1 of the third rail member 430 is supported may be provided on an inner circumferential surface of the first rail member flange 412. Accordingly, the first ball B1 of the third rail member 430 may slide along the first rail raceway 416 in rolling contact with the first rail member 410. The first rail raceway 416 may be provided in a length direction of the first rail member 410 to accommodate the first ball B1.

The second rail member 420 may be slidably coupled to the first rail member 410. The second rail member 420 may be coupled to an inner side of the first rail member flange 412 of the first rail member 410. The second rail member 420 may include the second rail member body 421 and second rail body flanges 422 provided to be bent from both sides of the second rail member body 421.

The third rail member 430 may be provided between the first rail member 410 and the second rail member 420 and may support a sliding movement of the second rail member 420. The third rail member 430 may include a plurality of first balls B1 and a third rail member body 431 rotatably supporting the plurality of first balls B1.

The third rail member body 431 may include a first ball groove 432 into which the first ball B1 is rotatably inserted. Accordingly, the first ball B1 may be rotated to move along the first rail raceway 416 and an outer raceway 425 in a state of being inserted into the first ball groove 432.

The third rail member body 431 may include the first guide protrusion 433 and the second guide protrusion 434 which are guided by the first guider 413 by being inserted into the first guider 413.

Each of the first and second guide protrusions 433 and 434 may be provided by bending a portion of the third rail member body 431 toward the first rail member 410. However, the invention is not limited thereto, and the first and second guide protrusions 433 and 434 may be provided by coupling separate members to the third rail member body 431. The first guide protrusion 433 may be provided at one side of the third rail member body 431 in the second moving direction D2. The second guide protrusion 434 may be provided at one side of the third rail member body 431 in the first moving direction D1.

The elastic member 440 may include various members having elasticity such as an elastic band or a coil spring, and both end portions of the elastic member 440 may be fixed to each of one area of the first rail member 410 and one area of the second rail member 420. FIGS. 13 and 14 illustrate the elastic member 440 including a coil spring as an example.

In an exemplary embodiment, the elastic member 440 may include a first elastic member 440A and a second elastic member 440B. One side of the first elastic member 440A may be fixed to the first support protrusion 414 of the first rail member 410, and the other side of the first elastic member 440A may be fixed to the third support protrusion 423 of the second rail member 420. One side of the second elastic member 440B may be fixed to the second support protrusion 415 of the first rail member 410, and the other side of the second elastic member 440B may be fixed to the fourth support protrusion 424 of the second rail member 420.

When an external impact is not applied to the foldable display device 1, an elastic force of the elastic member 440 may be sufficient as long as the elastic member 440 may maintain a state in which the first rail member 410 and the second rail member 420 do not slide with each other. That is, when an external impact is applied to the foldable display device 1, the elastic member 440 may be deformed to absorb the impact. However, when an external impact is not applied to the foldable display device 1, the elastic member 440 may not be deformed to maintain a position of the display module 100.

Figure 15:
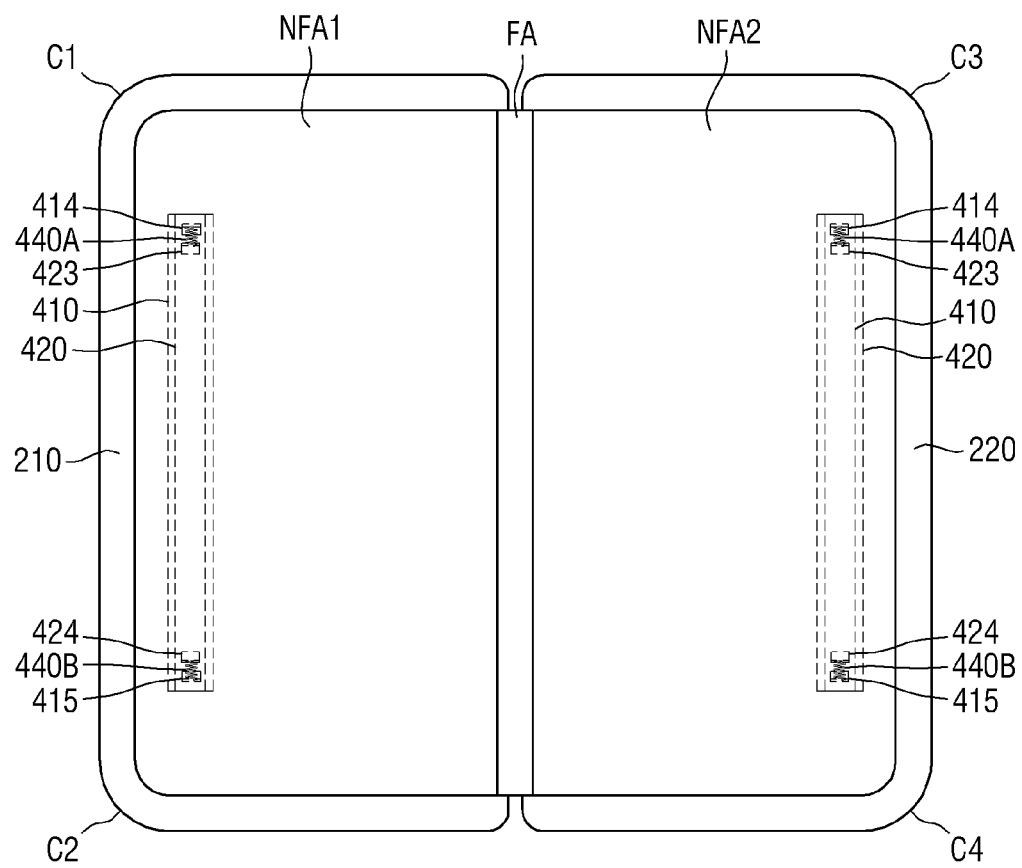
FIG. 15 is a transparent plan view illustrating an exemplary embodiment of a state in which an external impact is not applied to the foldable display device.
Figure 16:
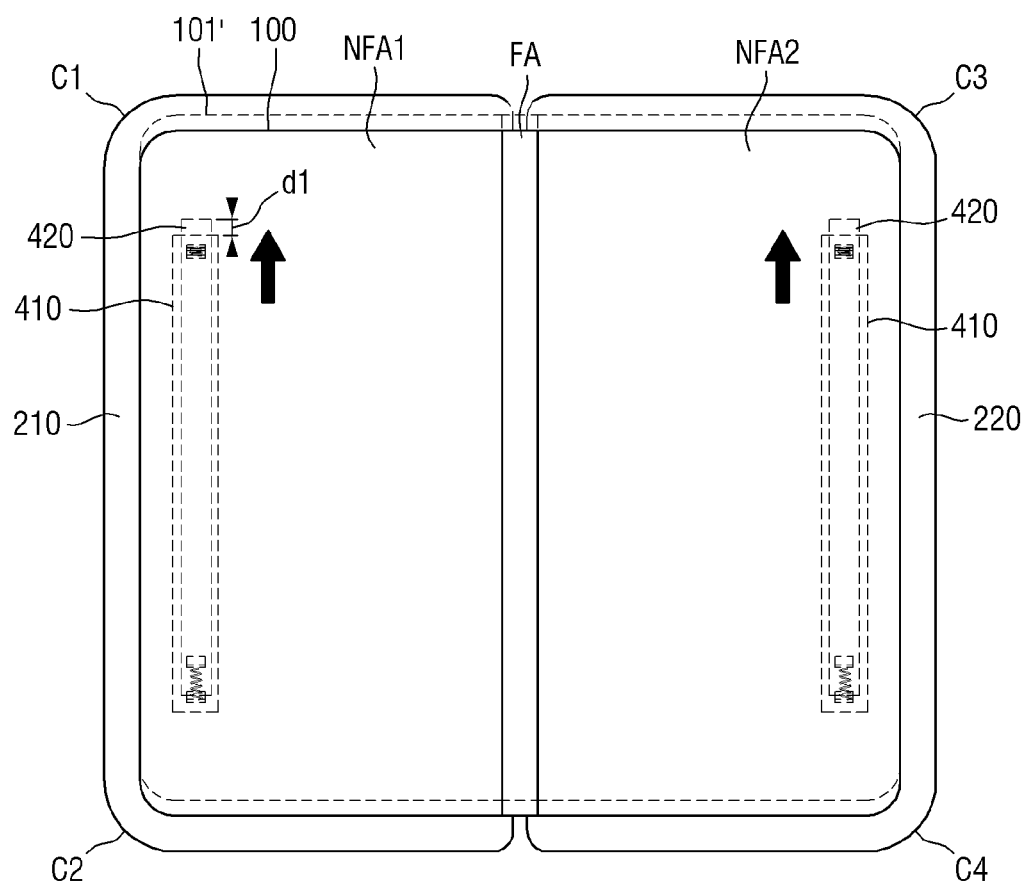
FIG. 16 is a transparent plan view illustrating an exemplary embodiment of a state in which an external impact is applied to the foldable display device.

FIG. 15 is a transparent plan view illustrating an exemplary embodiment of a state in which an external impact is not applied to the foldable display device. FIG. 16 is a transparent plan view illustrating an exemplary embodiment of a state in which an external impact is applied to the foldable display device.

Referring to FIGS. 4, 15, and 16, the foldable display device 1 may include the first support member 210 and the second support member 220. The display module 100 may be disposed on the first and second support members 210 and 220. The foldable display device 1 may include a first corner area C1 at an upper left side thereof, a second corner area C2 at a lower left side thereof, a third corner area C3 at an upper right side thereof, and a fourth corner area C4 at a lower right side thereof.

The rails 400 may be disposed at one side on the first support member 210 and one side on the second support member 220 in the second direction DR2. However, the number and arrangement of the rails 400 are not limited thereto. In an exemplary embodiment, one rail 400 may be disposed at each of one side and the other side on the first support member 210 in the second direction DR2, where the other side is an area near the folding area FA of the display module 100, for example. In addition, one rail 400 may be disposed at each of one side and the other side on the second support member 220 in the second direction DR2, where the other side is an area near the folding area FA of the display module 100.

The rail 400 may include the first rail member 410 and the second rail member 420. The first rail member 410 may be attached to one surface of the first support member 210, and the second rail member 420 may be attached to one surface of the display module 100 opposite to the first support member 210.

The rail 400 provides a separation space for reducing an external impact applied to the foldable display device 1. Here, as shown in FIG. 15, the separation space may include a first separation space defined as a distance obtained by subtracting a length of the contracted elastic member 440 from the shortest distance between the first support protrusion 414 of the first rail member 410 and the third support protrusion 423 of the second rail member 420 and a second separation space defined as a distance obtained by subtracting the length of the contracted elastic member 440 from the shortest distance between the second support protrusion 415 of the first rail member 410 and the fourth support protrusion 424 of the second rail member 420. The first separation space and the second separation space may have the same length as each other.

The rail 400 in the exemplary embodiment may be manufactured in the form of a straight line. The second rail member 420 may be moved by a predetermined distance from one side (for example, a lower area of the display panel 110 of FIG. 15) to the other side (the upper area of the display panel 110 of FIG. 15) in the second direction DR2 or may be moved by the first and second separation spaces from the other side (the upper area of the display panel 110 of FIG. 15) to one side (for example, a lower area of the display panel 110 of FIG. 15) with respect to the first rail member 410.

When a user drops the foldable display device 1 while gripping and using the foldable display device 1, the foldable display device 1 may collide with the ground from the second corner area C2, for example.

In this case, when the display module 100 is coupled to the first and second support members 210 and 220 through an adhesive member, an external impact may be mostly transmitted to the display module 100, a force that moves from the second corner area C2 to the first corner area C1 may act on the first non-folding area NFA1 of the display module 100 by the external impact. A force that moves from the third corner area C3 to the fourth corner area C4 may act on the second non-folding area NFA2 by gravity. As a result, the display module 100 near the second corner area C2 subjected to the external impact may be damaged, and also there may be distortions that move in opposite directions with respect to the folding area FA. Therefore, even the folding area FA of the display module 100 may be damaged.

However, according to the illustrated exemplary embodiment, when an external impact is transmitted to the display module 100, the external impact may be distributed through the rail 400, thereby reducing a distortion phenomenon occurring in the folding area FA of the display module 100. That is, the second rail member 420 coupled to the first rail member 410 may slide by a first distance d1 from the second and fourth corner areas C2 and C4 to the first and third corner areas C1 and C3 in the second direction DR2.

In other words, the display module 100 to which the second rail member 420 is attached may slide by the first distance d1 from the second and fourth corner areas C2 and C4 to the first and third corner areas C1 and C3 in the second direction DR2 with respect to the first support member 210 and the second support member 220, to which the first rail members 410 are attached.

Thus, when an external impact is applied to one side of the first support member 210 or the second support member 220 coupled to the case of the foldable display device 1, the display module 100 may be moved by a predetermined distance through the rail 400 in a direction opposite to a direction in which the impact is applied, thereby reducing a risk of damage caused by the impact.

In addition, when the rail 400 includes the elastic member 440, the display module 100 may be vibrated in the first moving direction D1 and the second moving direction D2, thereby further reducing the external impact.

Hereinafter, other exemplary embodiments will be described. In the following exemplary embodiments, a description of the same configuration as that of the previously described exemplary embodiment will be omitted or simplified, and differences will be mainly described.

Figure 17:
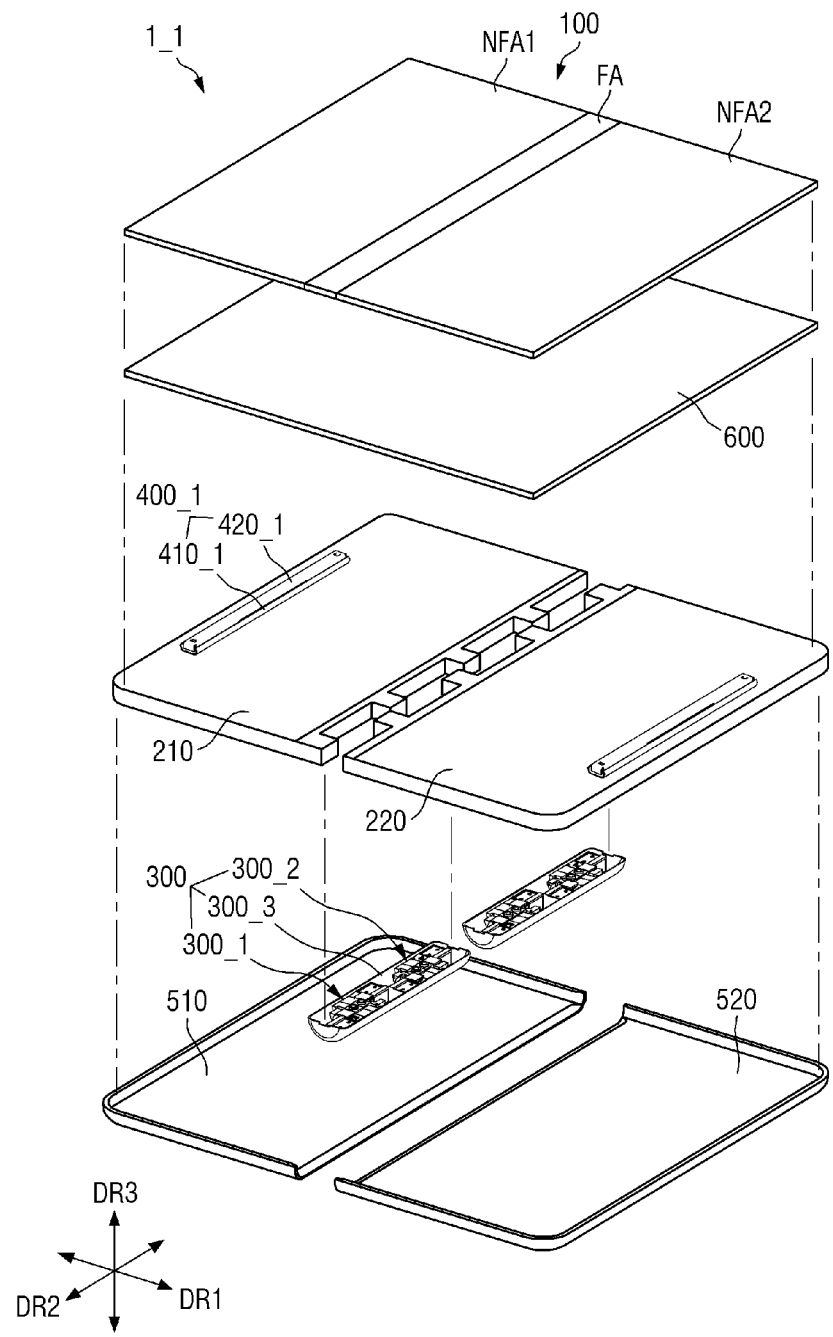
FIG. 17 is an exploded perspective view illustrating an exemplary embodiment of a foldable display device.

FIG. 17 is an exploded perspective view illustrating an exemplary embodiment of a foldable display device.

Referring to FIG. 17, a foldable display device 1_1 according to the illustrated exemplary embodiment is different from the display device 1 shown in FIG. 4 in that the foldable display device 1_1 further includes a metal plate 600 between a display module 100 and a folding member FM. The illustrated exemplary embodiment also has the same effects as the exemplary embodiment of FIG. 4.

More specifically, in the foldable display device 1_1 shown in FIG. 17, a lower surface of the display module 100 and an entire upper surface of a metal plate 600 are coupled to each other. A plurality of rail members 400 may be coupled to both sides of a lower surface of the metal plate 600.

In an exemplary embodiment, a first support member 210, a second support member 220, and the metal plate 600 may be coupled to a first rail member 410, and the metal plate 600 may be coupled to a second rail member 420 to be slidable. As a result, when an external impact is applied to the foldable display device 1_1, the entirety of the display module 100 may be slid, thereby reducing the risk of damage.

The metal plate 600 may also include a metal sheet having rigidity capable of sufficiently withstanding folding and unfolding of the display module 100. The metal sheet may have a thickness of 0.1 mm or less. The metal sheet may include an invar alloy. The exemplary embodiment of the invention is not limited thereto. In an exemplary embodiment, the metal sheet may include steel use stainless ("SUS"), for example.

The metal plate 600 may be coupled to the non-folding areas (flat areas) NFA1 and NFA2 of the display module 100 through an adhesive layer (not shown). The metal plate 600 is not coupled to a folding area FA of the display module 100. That is, the metal plate 600 may be fixed to the non-folding areas (flat areas) NFA1 and NFA2 of the display module 100 but may not be fixed to the folding area FA of the display module 100 and thus may maintain a slightly floating state.

Figure 18:
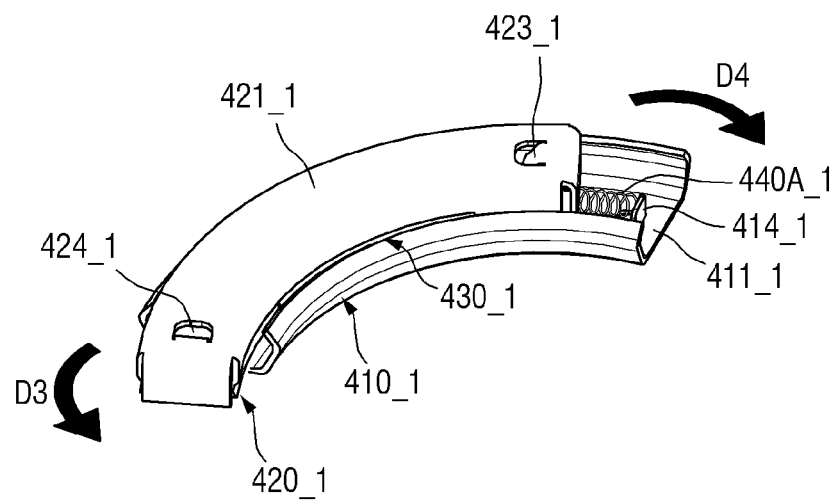
FIG. 18 is a perspective view illustrating an exemplary embodiment of a coupled state of a rail.
Figure 19:
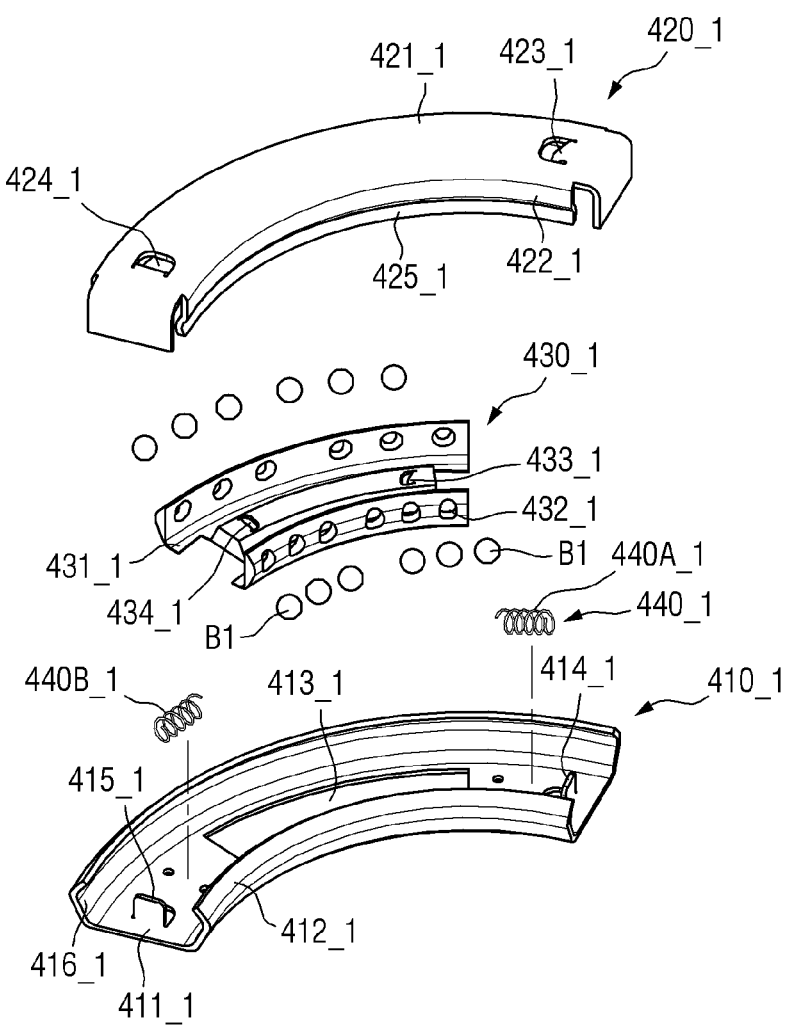
FIG. 19 is an exploded perspective view illustrating the rail shown in FIG. 18.
Figure 20:
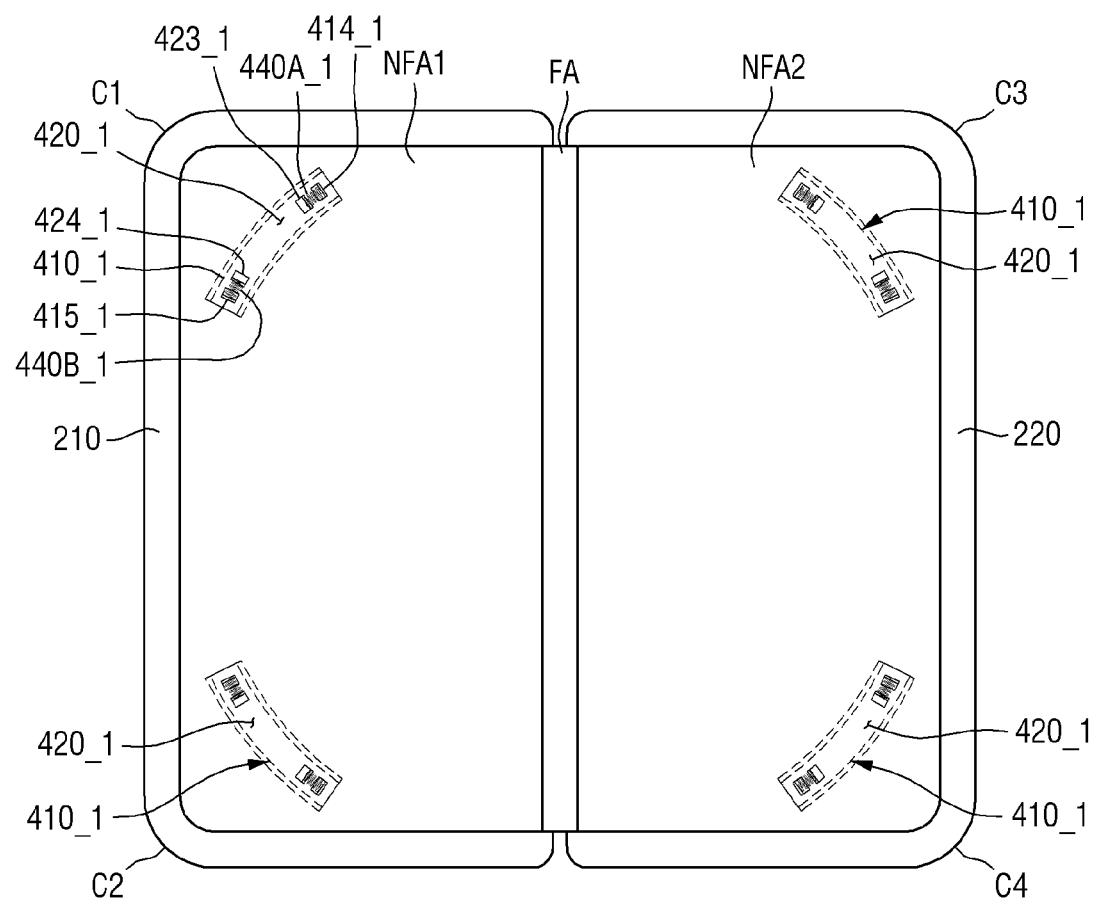
FIG. 20 is a transparent plan view illustrating an exemplary embodiment of a state in which an external impact is not applied to a foldable display device.

FIG. 18 is a perspective view illustrating an exemplary embodiment of a coupled state of a rail. FIG. 19 is an exploded perspective view illustrating the rail shown in FIG. 18. FIG. 20 is a transparent plan view illustrating an exemplary embodiment of a state in which an external impact is not applied to a foldable display device. FIG. 20 is a transparent plan view illustrating an exemplary embodiment of a state in which an external impact is applied to the foldable display device.

Referring to FIGS. 1 to 4 and 18 to 21, the illustrated exemplary embodiment is different from the exemplary embodiment shown in FIGS. 13 to 16 in that a rail 400_1 is has the form of a curved line instead of a straight line and a display module 100 coupled to first and second support members 210 and 200 slides in a clockwise or counterclockwise direction when an external impact is applied to a foldable display device 1_1.

More specifically, the rail 400_1 may include a first rail member 410_1 attached to one surface of the first support member 210, a second rail member 420_1 attached to one surface of the display module 100 opposite to the first support member 210 and slidably coupled to the first rail member 410_1, a third rail member 430_1 which supports a sliding movement of the first rail member 410_1 and the second rail member 420_1, and an elastic member 440_1 which mitigates an impact when the first rail member 410_1 and the second rail member 420_1 slide.

The first rail member 410_1, the second rail member 420_1, and the third rail member 430_1 may have the form of a curved line instead of a straight line. In an exemplary embodiment, a third moving direction D3 may be a counterclockwise direction, and a fourth moving direction D4 may be a clockwise direction.

The first rail member 410_1 is attached to one surface of the first support member 210 to support the display module 100 to be slidable. The first rail member 410_1 may include a first rail member body 411_1 and first rail member flanges 412_1 provided to be bent from both sides of the first rail member body 411_1.

In order to prevent the second rail member 420_1 from deviating in the fourth moving direction D4, a first support protrusion 414_1 may be provided at one side of the first rail member body 411_1 in the fourth moving direction D4 so as to support a third support protrusion 423_1 provided in the second rail member 420_1. The first support protrusion 414_1 may be provided by bending a portion of the first rail member body 411_1 in a direction in which the second rail member 420_1 is coupled. The third support protrusion 423_1 may be provided by bending a portion of the second rail member body 421_1 in a direction in which the first rail member 410_1 is coupled. Accordingly, the second rail member 420_1 may be prevented from deviating from the first rail member 410_1 in the fourth moving direction D4.

In order to prevent the second rail member 420_1 from deviating in the third moving direction D3, a second support protrusion 415_1 may be provided at one side of the first rail member body 411_1 in the third moving direction D3 so as to support a fourth support protrusion 424_1 provided in the second rail member 420_1. The second support protrusion 415_1 may be provided by bending a portion of the first rail member body 411_1 in a direction in which the second rail member 420_1 is coupled. The fourth support protrusion 424_1 may be provided by bending a portion of the second rail member body 421_1 in a direction in which the first rail member 410_1 is coupled. Accordingly, the second rail member 420_1 may be prevented from deviating from the first rail member 410_1 in the third moving direction D3.

The first rail member body 411_1 may include a first guider 413_1 into which a first guide protrusion 433_1 and a second guide protrusion 434_1 of the third rail member 430_1 are inserted and which guides the first guide protrusion 433_1 and the second guide protrusion 434_1. The first guider 413_1 may be provided along a movement path of the first guide protrusion 433_1 and the second guide protrusion 434_1. One side surface of the first guider 413_1 in the fourth moving direction D4 may be in contact with the first guide protrusion 433_1 and may restrict the first guide protrusion 433_1 from moving in the fourth moving direction D4. One side surface of the first guider 413_1 in the third moving direction D3 may be in contact with the second guide protrusion 434_1 and may restrict the second guide protrusion 434_1 from moving in the third moving direction D3.

A first rail raceway 416_1 on which a first ball B1 of the third rail member 430_1 is supported may be provided on an inner circumferential surface of the first rail member flange 412_1. Accordingly, the first ball B1 of the third rail member 430_1 may slide along the first rail raceway 416_1 in rolling contact with the first rail member 410_1. The first rail raceway 416_1 may be provided in a length direction of the first rail member 410_1 to accommodate the first ball B1.

The second rail member 420_1 may be slidably coupled to the first rail member 410_1. The second rail member 420_1 may be coupled inside the first rail member flange 412_1 of the first rail member 410_1. The second rail member 420_1 may include a second rail member body 421_1 and second rail body flanges 422_1 provided to be bent from both sides of the second rail member body 421_1.

The third rail member 430_1 may be provided between the first rail member 410_1 and the second rail member 420_1 and may support a sliding movement of the second rail member 420_1. The third rail member 430_1 may include a plurality of first balls B1 and a third rail member body 431_1 rotatably supporting the plurality of first balls B1.

The third rail member body 431_1 may include a first ball groove 432_1 into which the first ball B1 is rotatably inserted. Accordingly, the first ball B1 may be rotated to move along the first rail raceway 416_1 and an outer raceway 425_1 in a state of being inserted into the first ball groove 432_1.

The third rail member body 431_1 may include the first guide protrusion 433_1 and the second guide protrusion 434_1 which are guided by the first guider 413_1 by being inserted into the first guider 413_1.

Each of the first and second guide protrusions 433_1 and 434_1 may be provided by bending a portion of the third rail member body 431_1 toward the first rail member 410_1. However, the invention is not limited thereto, and the first and second guide protrusions 433_1 and 434_1 may be provided by coupling separate members to the third rail member body 431_1. The first guide protrusion 433_1 may be provided at one side of the third rail member body 431_1 in the fourth moving direction D4. The second guide protrusion 434_1 may be provided at one side of the third rail member body 431_1 in the third moving direction D3.

The elastic member 440_1 may include various members having elasticity such as an elastic band or a coil spring, and both end portions of the elastic member 440_1 may be fixed to each of one area of the first rail member 410_1 and one area of the second rail member 420_1. FIGS. 18 and 19 illustrate an exemplary embodiment of the elastic member 440_1 including a coil spring.

In an exemplary embodiment, the elastic member 440_1 may include a first elastic member 440A_1 and a second elastic member 440B_1. One side of the first elastic member 440A_1 may be fixed to the first support protrusion 414_1 of the first rail member 410_1, and the other side of the first elastic member 440A_1 may be fixed to the third support protrusion 423_1 of the second rail member 420_1. One side of the second elastic member 440B_1 may be fixed to the second support protrusion 415_1 of the first rail member 410_1, and the other side of the second elastic member 440B_1 may be fixed to the fourth support protrusion 424_1 of the second rail member 420_1.

When an external impact is not applied to the foldable display device 1_1, an elastic force of the elastic member 440_1 may be sufficient as long as the elastic member 440_1 may maintain a state in which the first rail member 410_1 and the second rail member 420_1 do not slide with each other. That is, when an external impact is applied to the foldable display device 1_1, the elastic member 440_1 may be deformed to absorb the impact. However, when an external impact is not applied to the foldable display device 1_1, the elastic member 440_1 may not be deformed to maintain a position of the display module 100.

Figure 21:
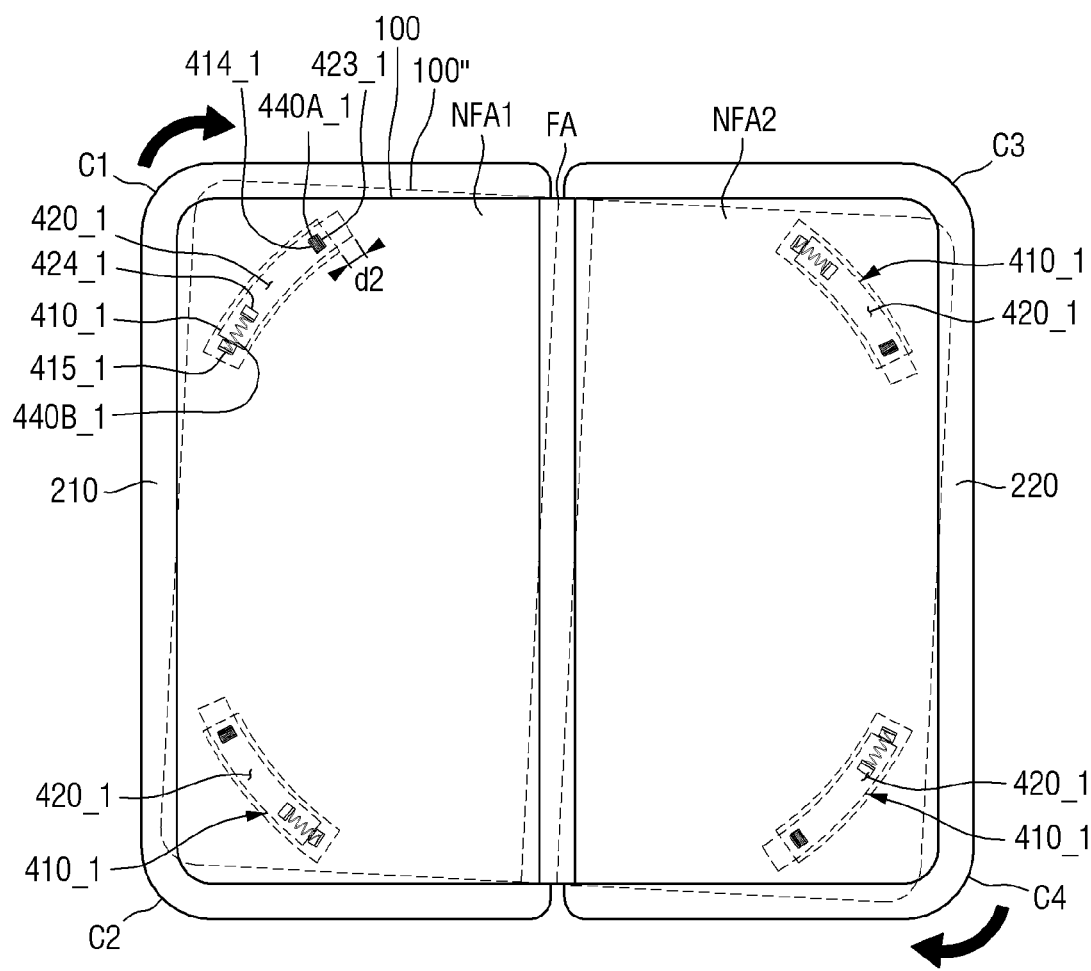
FIG. 21 is a transparent plan view illustrating an exemplary embodiment of a state in which an external impact is applied to the foldable display device.

FIG. 20 is a transparent plan view illustrating an exemplary embodiment of a state in which an external impact is not applied to the foldable display device. FIG. 21 is a transparent plan view illustrating an exemplary embodiment of a state in which an external impact is applied to the foldable display device.

Referring to FIGS. 4, 20, and 21, the foldable display device 1 may include the first support member 210 and the second support member 220. The display module 100 may be disposed on the first and second support members 210 and 220. The foldable display device 1 may include a first corner area C1 at an upper left side thereof, a second corner area C2 at a lower left side thereof, a third corner area C3 at an upper right side thereof, and a fourth corner area C4 at a lower right side thereof.

A plurality of rails 400_1 may be disposed near the first corner area C1 and the second corner area C2 on the first support member 210 and the third corner area C3 and the fourth corner area C4 on the second support member 220. In an exemplary embodiment, the plurality of rails 400_1 may be disposed along a circumference of an imaginary circle such that the display panel 110 may slide in a clockwise or counterclockwise direction. That is, the rail 400_1 may correspond to an arc of the imaginary circle.

The rail 400_1 may include a first rail member 410_1 and a second rail member 420_1. The first rail member 410_1 may be attached to one surface of the first support member 210, and the second rail member 420_1 may be attached to one surface of the display module 100 opposite to the first support member 210.

The rail 400_1 provides a separation space for reducing an external impact applied to the foldable display device 1. Here, the separation space may include a first separation space defined as a distance obtained by subtracting a length of the contracted elastic member 440_1 from the shortest distance between the first support protrusion 414_1 of the first rail member 410_1 and the third support protrusion 423_1 of the second rail member 420_1 and a second separation space defined as a distance obtained by subtracting the length of the contracted elastic member 440_1 from the shortest distance between the second support protrusion 415_1 of the first rail member 410_1 and the fourth support protrusion 424_1 of the second rail member 420_1. The first separation space and the second separation space may have the same length as each other.

The rail 400_1 in the exemplary embodiment may be manufactured in the form of a curved line. The second rail member 420_1 may be moved in a clockwise direction by a predetermined distance in a fourth direction DR4 or may be moved in a counterclockwise direction by the first and second separation spaces with respect to the first rail member 410_1.

When a user drops the foldable display device 1 while gripping and using the foldable display device 1, the foldable display device 1 may collide with the ground from the second corner area C2, for example.

In this case, when the display module 100 is coupled to the first and second support members 210 and 220 through an adhesive member, an external impact may be mostly transmitted to the display module 100, a force that moves from the second corner area C2 to the first corner area C1 may act on the first non-folding area NFA1 of the display module 100 by the external impact. A force that moves from the third corner area C3 to the fourth corner area C4 may act on the second non-folding area NFA2 by gravity. As a result, the display module 100 near the second corner area C2 subjected to the external impact may be damaged, and also there may be distortions that move in opposite directions with respect to the folding area FA. Therefore, the folding area FA of the display module 100 may also be damaged.

However, according to the illustrated exemplary embodiment, when an external impact is transmitted to the display module 100, the external impact may be distributed through the rail 400_1, thereby reducing a distortion phenomenon occurring in the folding area FA of the display module 100. That is, the second rail member 420_1 coupled to the first rail member 410_1 may slide in a clockwise direction by a second distance d2 in the third direction DR3.

In other words, the display module 100 to which the second rail member 420_1 is attached may slide in the clockwise direction by the second distance d2 with respect to the first support member 210 and the second support member 220 in which the plurality of first rail members 410_1 are attached near corners thereof.

Thus, when an external impact is applied to one side of the first support member 210 or the second support member 220 coupled to a case of the foldable display device 1, the display module 100 may be moved by a predetermined distance through the rail 400_1 in a direction opposite to a direction in which the impact is applied, thereby reducing a risk of damage caused by the impact.

In addition, when the rail 400_1 includes the elastic member 440_1, the display module 100 may be vibrated in a clockwise direction and a counterclockwise direction, thereby further reducing an external impact.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A foldable display device comprising:
    a first support member and a second support member separated from each other and each including a short side and a long side;
    a display module disposed on the first support member and the second support member;
    a hinge which couples a side of the first support member and a side of the second support member;
    a plurality of first rails disposed between the first support member and the display module and disposed in areas near intersections between the short side and the long side of the first support member; and
    a plurality of second rails disposed between the second support member and the display module and disposed in areas near intersections between the short side and the long side of the second support member,
    wherein the plurality of first rails and the plurality of second rails are slidable in a first moving direction and a second moving direction opposite to the first moving direction.

2. The foldable display device of claim 1, wherein the plurality of first rails and the plurality of second rails have a form of a curved line and are disposed along a circumference of an imaginary circle,
    the first moving direction is a clockwise direction, and
    the second moving direction is a counterclockwise direction.

3. The foldable display device of claim 1, wherein the plurality of first rails and the plurality of second rails include a first rail member attached to a surface of the first support member and including a first guider and a second rail member attached to a surface of the display module opposite to the first support member and slidably coupled to the first rail member.

4. The foldable display device of claim 3, wherein the first rail member further includes a first support protrusion disposed at a side thereof in the first moving direction and a second support protrusion disposed at a side thereof in the second moving direction, and
    the second rail member includes a third support protrusion disposed at a side thereof in the first moving direction and a fourth support protrusion disposed at a side thereof in the second moving direction,
    wherein the third support protrusion is prevented from moving in the first moving direction by the first support protrusion, and
    the fourth support protrusion is prevented from moving in the second moving direction by the second support protrusion.

5. The foldable display device of claim 4, wherein the plurality of first rails and the plurality of second rails further include an elastic member disposed between the first support protrusion and the third support protrusion and between the second support protrusion and the fourth support protrusion.

6. The foldable display device of claim 5, wherein the elastic member has an elastic force to prevent a sliding movement of the first rail member and the second rail member when an external impact is not applied to at least one of the first support member and the second support member.

\* \* \* \* \*